United States Patent [19]

Brokaw et al.

[11] 3,882,484

[45] May 6, 1975

[54] NON-LINEAR ENCODER AND DECODER

[75] Inventors: Adrian Paul Brokaw, Woburn; Daniel Y. S. Chin, Needham, both of Mass.

[73] Assignee: Wescom, Inc., Downers Grove, Ill.

[22] Filed: Oct. 30, 1972

[21] Appl. No.: 302,101

[52] U.S. Cl. .......................... 340/347 AD; 325/38 R

[51] Int. Cl. ............................................ H03k 13/02

[58] Field of Search ...... 340/347 AD, 347 DA, 340/347 CC, 340/203, 204; 179/15 AP, 15 AV; 324/99 D; 235/154; 325/38 R, 141

[56] References Cited

UNITED STATES PATENTS

| | | | |
|---|---|---|---|
| 2,592,308 | 4/1952 | Meacham | 340/347 AD UX |
| 3,133,278 | 5/1964 | Millis | 340/347 AD |
| 3,207,986 | 9/1965 | Bailey | 179/15 AP |
| 3,308,392 | 3/1967 | McCarter | 340/347 AD UX |
| 3,382,438 | 5/1968 | Geller | 325/38 R |
| 3,414,818 | 12/1968 | Reidel | 340/347 AD |
| 3,432,754 | 3/1969 | Schwartz | 340/347 AD |
| 3,438,024 | 4/1969 | Smith | 340/347 CC |
| 3,550,115 | 12/1970 | Picou et al. | 340/347 AD |
| 3,573,443 | 4/1971 | Fern | 340/347 DA |
| 3,573,804 | 4/1971 | Picou | 340/347 AD |
| 3,582,939 | 6/1971 | Campbell | 340/347 DA |
| R23,579 | 11/1952 | Pierce | 325/38 R |

*Primary Examiner*—Charles D. Miller

*Attorney, Agent, or Firm*—Wolfe, Hubbard, Leydig, Voit & Osann, Ltd.

[57] ABSTRACT

An encoder for serially converting pulse amplitude modulated (PAM) samples into pulse code modulated (PCM) code words and a complementary decoder for serially recovering the quantized values of the samples from the code words include respective multi-stage resistive ladder attenuators which are matched, with each attenuator having several substantially independent stages, one for each weighted time slot of the PCM code word, which are assigned respective factors from a predetermined set of factors and which are selectively switched into and out of the attenuator such that the factor assigned to each stage is multiplicatively contributed to or withheld from the overall signal attenuation level afforded by the attenuator. The encoding process involves summing the sample with a reference voltage of appropriate polarity and then progressively factoring the sum by stepping the encoder attenuator in timed synchronism with the successive weighted time slots of the code words to provide a series of trial divisors which cause the encoder to generate bits with logic levels digitally indicating those of the factors that are and are not factors of the sum voltage as the sum voltage is divided to converge on the reference voltage. The decoding process, on the other hand, involves setting the decoder attenuator to provide a multiplier comprising the multiplicative combination of the factors of the sum voltage as identified by the bits of the code word, multiplying the reference voltage by the multiplier, and then subtracting the reference voltage to obtain the quantized value corresponding to the original sample. For bipolar encoding and decoding the first time slot of each code word is reserved for a sign bit and the reference voltages for the encoder and decoder are adjusted at the outset of each cycle to reflect the polarity of the sample. Appropriate selection of the reference voltage magnitude and of the factors comprised by the encoder and decoder attenuators provides complementary non-linear encoding and decoding in accordance with a known companding function of proven effectivity for maintaining a relatively high signal-to-distortion ratio with only a relatively few time slots alotted each PCM code word.

18 Claims, 14 Drawing Figures

NON-LINEAR ENCODER AND DECODER

BACKGROUND OF THE INVENTION

This invention relates generally to pulse code modulation (PCM) systems and, more particularly, to encoders (analog-to-digital converters) and decoders (digital-to-analog converters) for such systems. While methods and means for non-linear encoding and decoding are emphasized, it will be understood that certain aspects of the invention are of more general utility.

PCM has been widely adopted for transmission and processing of analog information. For example, it is a convenient format for reading information into and out of digital computers and for the digital display of the outputs provided by various types of instrumentation. It is also employed in telephony, especially in so-called carrier systems.

The major advantage of PCM is that it enables a substantial quantity of information to be transmitted relatively rapidly with little risk of signal deterioration. The pulse code modulated information is carried by weighted-by-position code words, each comprising a predetermined number of equal length pulse positions or time slots, with the result that the information content of each code word is fully defined by the presence or absence of pulses in each of its time slots. Thus, variations in pulse height, width and shape may be tolerated to the extent that such variations do not prevent a pulse-no pulse determination from being made on a time slot-by-time slot basis. Moreover, there are repeater amplifiers for regenerating the PCM line signal substantially free of the distortion and noise which might otherwise tend to accumulate to an objectionably high level in those instances involving transmission over an appreciable distance.

Distortion of the base signal is, nevertheless, of substantial concern in PCM systems. Because only a fixed number of time slots are allotted to each code word, each PCM code word can represent only a finite number of different, discontinuous signal levels. PCM, therefore, involves a so-called "quantization process" in which a more or less continuous range of possible input signals is divided into subranges and one of the discrete signal levels comprised by the code is assigned to each subrange. The signal level or "code step" for each subrange is the "quantized value" which is transmitted whenever the input signal falls anywhere within the particular subrange. Accordingly, there often is a difference between the actual input signal level and the corresponding discrete value assigned thereto in the quantization process. This difference is called "quantization error" and is responsible for what is commonly referred to as "quantization distortion" or "noise."

Quantization distortion is of principal interest when considered in the context of the related signal level because it is the signal-to-distortion ratio which determines the transmission quality. If the quantization is carried out linearly--i.e., by dividing the range of signals to be transmitted into equal size subranges - the signal-to-distortion ratio is much higher for higher levels than for lower levels. It is, of course, theoretically possible to increase the number of time slots alloted to each code word until the point is reached at which there is an acceptably high signal-to-distortion ratio for even the very weakest input signals of interest. Preferably, however, the number of time slots required per code word is minimized. Thus, non-linear encoding and decoding techniques have been devised to obtain a substantially linear overall transmission characteristic, together with a generally uniform signal-to-distortion ratio throughout the entire signal range of interest.

The uniform signal-to-distortion ratio is obtained through companding by having the subrange (step interval) of each code step equal to approximately 1/10 of the step value. The step interval varies from 1/10 of the maximum encodable level to 1/1000 of the maximum encodable level. The minimum step interval is also the minimum step level. When signal to quantizing distortion ratios are calculated, the ratio is 23 dB from maximum step level to OdB at the minimum step level. It remains high at approximately 22 dB from maximum step level to about 1/100 of maximum step level and then linearly degrades to zero at 1/1000 of maximum step level.

Various companding functions and circuits for achieving them have been suggested. For example, one of the more common approaches has been to employ linear encoding and decoding as intermediate steps between the signal compression and expansion operations of a diode-type compander. It has previously been recognized that this indirect method of non-linear encoding and decoding has a number of disadvantages, including the care which must be exercised to initially select diodes with matching characteristics and the provision which is required to preserve those characteristics under all operating conditions, typically by housing the diodes within temperature controlled ovens. The alternatives which have been proposed have not, however, been entirely satisfactory. For example, it has been suggested that the encoder and decoder comprise logarithmically weighted attenuators controlled to carry out the companding directly as an integral part of the encoding and decoding operations. While that suggestion offers a relatively economical alternative for avoiding the disadvantages inherent in the use of a separate diode compander, it has not heretofore been widely adopted because simply derived logarithmic functions have been incapable of approaching the performance that may be achieved with a diode compander due to the necessity for precisely matching compression and expansion characteristics.

SUMMARY OF THE INVENTION

The primary object of this invention is to provide relatively simple but highly reliable methods and means for encoding and decoding.

In keeping with that aim, we have developed a multistage attenuator, together with a method and means for encoding and decoding through the use of that attenuator. The attenuator comprises a plurality of mutually independent stages, each of which may be selectively inserted into and removed from attenuating relationship with an applied signal to respectively multiplicatively contribute or withhold a predetermined factor to or from the overall signal attenuation afforded by the attenuator. Thus, the attenuation may be incrementally adjusted to any one of a number of different levels, ranging from none at all when all stages are removed to an upper limit substantially equal to the product of the attenuation factors of the stages when all stages are inserted. We have found that our attenuator is especially suitable for use in encoders and decoders. Among the advantages that are gained thereby is that the encoder and decoder performance (as measured by the degree of accuracy with which the encoder and decoder transfer functions match the desired compression and expansion functions) is at least equal to the performance achieved with other decoding and encoding techniques and far superior to that which has heretofore been possible using prior art attenuators. The transfer functions are obtained without need for constant-temperature ovens or specially selected components as is the case with current practice.

Another object of this invention is to minimize the number of voltage and current sources required for encoding and decoding and to permit straightforward control of those that are employed.

Because our attenuator operates directly on the amplitude of the applied signal, encoding and decoding may each be carried out with a single reference source. If both positive and negative signals are of interest, the polarities of the encoder and decoder reference voltages must both be adjusted to reflect the polarity of the applied signal, but once that adjustment is made no further changes are required for the balance of the encoding or decoding cycle.

A further object of this invention is to provide a relatively economical and highly accurate method and means for non-linear encoding and decoding.

We have found that a known companding function of proven effectivity for non-linear encoding and decoding can be converted to non-logarithmic form. The known companding function has the very desirable characteristic of providing a relatively high signal-to-distortion ratio for any given number of time slots permitted per PCM code word, but has heretofore been achieved only through the use of a separate diode-type compander. In contrast, our encoder and decoder are capable of non-linearly encoding and decoding, without the use of a separate compander, but still in conformity with the known companding function so as to provide substantially the same high signal-to-distortion ratio and thereby minimize the number of time slots required per code word.

Still other objects of this invention are realized because the non-linear encoding and decoding are carried out directly with purely resistive attenuators. For example, the encoding and decoding equipment may be remotely located and subjected to the ordinary temperature swings of an outdoors environment. Also, the encoding and decoding may be carried out at relatively high speeds since there is very little reactance to limit the permissible speed. Further, since the encoding and decoding are performed directly, the encoder and decoder have relatively stable zero reference levels.

Finally, it is an object of this invention to provide methods and means for encoding and decoding which may readily be adopted to generate and interpret a variety of different PCM code formats, including a straight binary code as well as an absolute value plus sign code.

As a matter of definition, each of the code words of a "straight binary code" has a plurality of weighted time slots for bits (1 or 0) which digitally indicate the magnitude (or, in other words, the absolute value) of the quantized value for the encoded signal relative to a reference level defined by one, generally the lowest or most negative, extreme of the signal range of interest. In an "absolute value plus sign code," on the other hand, each of the code words has a time slot for a sign bit to digitally indicate the polarity of the encoded signal, typically relative to a substantially zero or ground reference level, and a plurality of weighted time slots for bits to digitally indicate the magnitude of the quantized value for the encoded signal relative to that reference level. From the foregoing, it will be understood that the primary distinctions between the two code formats arise in the encoding and decoding of bipolar signals. The sign bit of the absolute value plus sign code is unnecessary and may be eliminated if the signals to be encoded are unipolar.

BRIEF DESCRIPTION OF THE DRAWINGS

Other objects and advantages of our invention will become apparent when the following detailed description is read in conjunction with the attached drawings, in which.

DETAILED DESCRIPTION OF THE ILLUSTRATED EMBODIMENT ENVIRONMENT

While the invention is described in detail hereinafter with reference to certain illustrated embodiments, it is to be understood that the intent is not to limit it to such details. To the contrary, the intent is to cover all modifications, alternatives and equivalents falling within the spirit and scope of the invention as defined by the appended claims.

Environment

Figure 1:
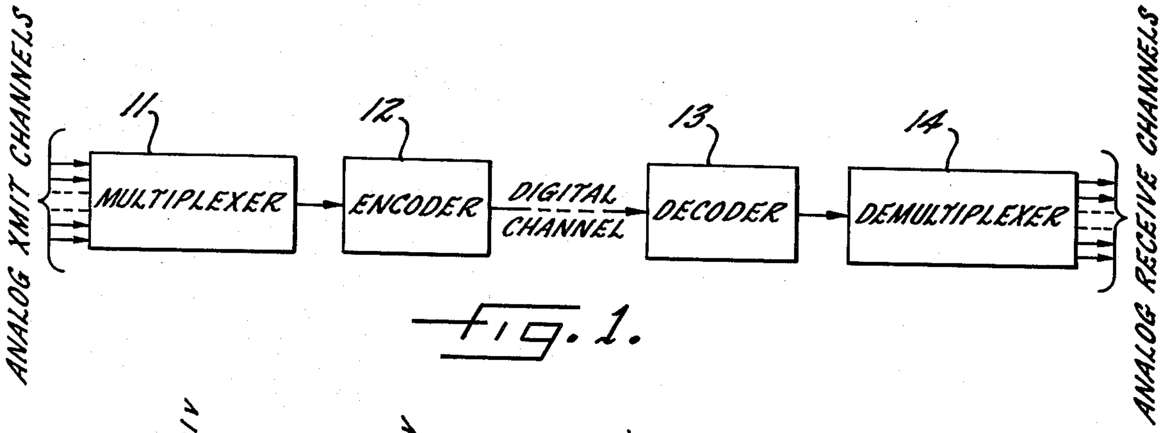
FIG. 1 is a simplified block diagram of a PCM system, such as might suitably include an encoder and a decoder constructed in accordance with this invention.

Turning now to the drawings, the particularly to FIG. 1, a time division multiplex-demultiplex system with encoding and decoding is shown as a typical environment for our invention. Apart from the novel method and means that are employed in accordance herewith for encoding and decoding, the illustrated system is a well known combination which permits a single digital channel to simultaneously but separately serve a plurality of analog channels. More particularly, at one end of the digital channel there is a multiplexer 11 for sequentially and cyclically sampling a plurality of analog transmit channels to provide a train of pulse amplitude modulated (PAM) samples, and an encoder (analog to digital converter) 12 for serially converting the PAM samples into pulse code modulated (PCM) code words for transmission through the digital channel. At the other end of the digital channel, there is a decoder (digital to analog converter) for serially processing the code words to recover the PAM samples as quantized by the encoder, and a demultiplexer 14 for distributing the quantized PAM samples to a plurality of analog receive channels. The transmit and receive channels are effectively paired - the analog information carried by the transmit channels is substantially reconstructed on a channel-by-channel basis in the receive channels. The multiplexer, encoder, decoder and demultiplexer are, of course, synchronized (with due allowance made for any significant transit times) so that the essential information of each PAM sample is retained. As a general rule, that is accomplished by operating them at a rate (which may conveniently be referred to as a "channel sampling rate") which is at least twice the upper frequency of the analog signals of interest. Also, repeater amplifiers (not shown) may be distributed along the digital channel as necessary to prevent loss of the information due to the transmission distortion and noise that may tend to accumulate.

As will be appreciated, the illustrated combination is suitable for a variety of applications, including some in which a digital computer may be interposed between the encoder and decoder. Furthermore, it is merely an exemplary environment for the invention. Indeed, the encoder and decoder may even be used separately, say, by having the encoder feed a digital display and by having the decoder fed by an electro-mechanical encoding device with a complementary encoding characteristic.

A more specific example may, however, be helpful to bring certain of the more detailed features of this invention into sharper focus. For that purpose, assume that the illustrated combination is one of two oppositely poled but otherwise identical portions of a carrier telephone system intended to provide 24 two-way telephone channels, with one digital facility provided for transmission in one direction and another digital facility provided for transmission in the opposite direction. In keeping with the customary requirements and limitations encountered in carrier telephony, it may be further assumed that the channel sampling rate is 8 KHz. to accommodate channel signaling and voice frequency signals having frequencies up to about 3.2 KHz., and that each digital channel or facility has a bandwidth of about 1.5 MHz. such as may be provided by utilizing available exchange grade cable. The objective is, of course, to provide voice grade transmission for each of the 24 telephone channels (i.e., paired transmit and receive channels).

As will be appreciated, the foregoing example is one instance in which linear encoding and decoding will not suffice. It can be demonstrated that if linear encoding and decoding were used, at least twelve time slots would be required for the information content of each PCM code word to hold the signal-to-distortion ratio sufficiently high for voice grade transmission. Consequently, in view of the 8 KHz. channel sampling rate, the digital bit rate would be in excess of $2 \times 10^6$ bits/-second, which is substantially higher than the maximum permissible bit rate for a digital channel having a bandwidth of only about 1.5 MHz. Of course, the limited bandwidth of the digital channel may not be ignored because a digital bit rate which appreciably exceeds the channel bandwidth leads to pulse smearing (pulses "tailing over" from one time slot to the next) which may be sufficient to prevent the necessary pulse-no pulse determination from being made on a time slot-by-time slot basis and to thereby cause the information content of the PCM signal to be lost.

There are, however, known non-linear encoding and decoding techniques for achieving voice grade transmission with far fewer time slots per PCM code word. As previously indicated, the encoding is carried out in accordance with a compression function and the decoding is carried out in accordance with a complementary expansion function.

Of the known compression functions for non-linear encoding, one of the more suitable is a function which can be generally expressed in normalized form as follows:

$$\frac{v_0}{V_0} = \frac{(\log_a \ C_1 + \mu \frac{v_1}{V_1})}{\log_a (C_2 + \mu)} \qquad (1)$$

Where:

$v_1$ = the voltage of the applied input signal (PAM sample);

$V_1$ = a preselected full scale or overload input voltage level;

$v_0$ = the PCM code word representing the quantized value of the input voltage $v_1$;

$V_0$ = the full scale PCM code word representing the quantized value of the overload input voltage $V_1$;

$\mu$ = a companding constant selected to control the degree of non-linearity afforded by the compression function;

$C_1$ and $C_2$ = further constants selected with $\mu$ to tailor the compression function; and $a$ = the base of the logarithms.

Those familiar with the prior applications of this compression function to carrier telephony may more readily recognize it in the more specialized form which it assumes when written in terms of natural logarithms with $C_1$ and $C_2$ each equal to unity:

$$\frac{v_0}{v_0} = \frac{\ln \ 1 + \mu \frac{v_1}{V_1}}{\ln(1+\mu)} \qquad (2)$$

Or, perhaps, some may be better acquainted with the alternate form:

$$v_0 = V_0 \frac{\ln\left(1+\mu \frac{v_1}{V_1}\right)}{\ln(1+\mu)} \quad (3)$$

Experience in carrier telephony has more or less empirically led to the conclusion that optimum values for the companding constant $\mu$ lie between 50 and 500.

Figure 2:
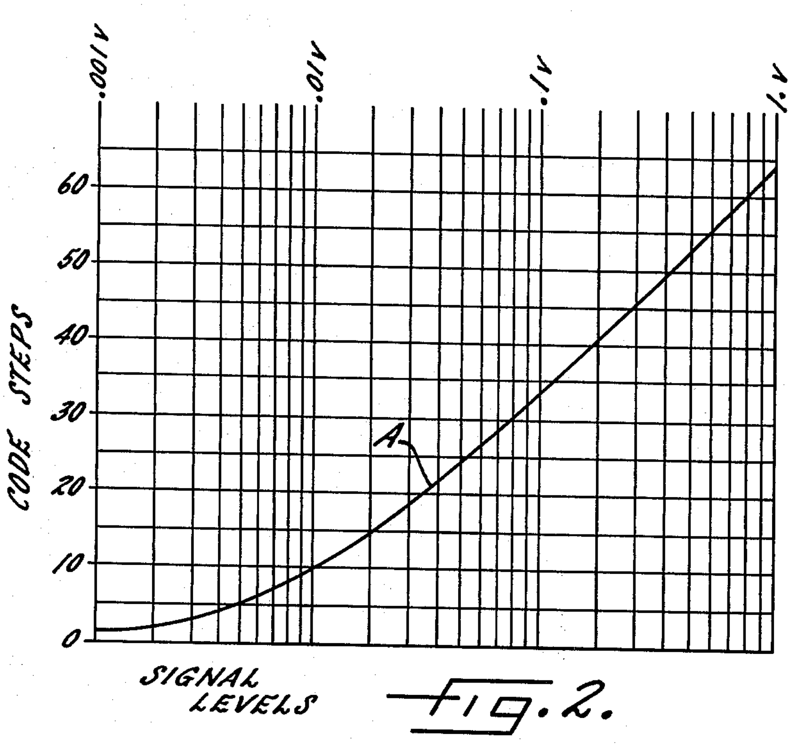
FIG. 2 is a semi-logarithmic graph on which a range of positive input signal levels, such as might typically be encountered in carrier telephony, has been plotted against the code steps typically available for encoding that range to illustrate the quasi - logarithmic non-linear encoding characteristic provided in keeping with one aspect of this invention and the correspondence of that characteristic to a known compression function of proven effectivity for realizing a relatively high signal-to-distortion ratio while carrying out the encoding with a minimum number of time slots per PCM code word.

The theoretical desirability of employing the compression function of equations (2) and (3) and its complementary expansion function for non-linear encoding and decoding has been demonstrated. As shown by curve A of FIG. 2 (which is based on a companding constant of 100), the compression function smoothly blends a generally linear response to low voltage levels with a generally logarithmic response to high voltage levels. Although curve A merely demonstrates the manner in which the code steps that are available for encoding positive input signals are distributed by encoding in accordance with the aforementioned compression function, it will be understood that the specialized compression function of equations (2) and (3), as well as the more generalized compression function of equation (1), may be employed for encoding both positive and negative input signals if the full scale input voltage $V_1$ assumes the sign of the applied input signal $v_1$.

The number of time slots allotted to each PCM code word does not alter the general applicability of the compression functions of equations (1)–(3) and their complementary expansion functions to non-linear encoding and decoding. It is, however, a very important factor insofar as the signal-to-quantization distortion is concerned. It is, therefore, worthy of note that it has been found that voice grade transmission may be achieved in carrier telephony with even as few as seven time slots for the voice frequency information content of each PCM code word if the encoding is carried out in accordance with the compression function of equations (2) and (3) and the decoding is carried out in accordance with the complementary expansion function. Hence, a 24 channel carrier telephone system may be served by a digital channel with a bandwidth of only about 1.5 MHz. Indeed, the customary practice in prior art carrier telephone systems of this type has been to include an eighth time slot in each code word for the low frequency or dc. signaling and supervisory signals (e.g., ringing signals and "on" or "off" hook signals) and to insert an additional time slot after each group of 24 code words for a so-called "framing" bit that is used for synchronizing purposes. Even then, however, the usual 8 KHz. channel sampling rate results in a digital bit rate of only $1.544 \times 10^6$ bits/second, a rate which can be handled by available exchange grade cable or the like without any significant loss in the information content of the PCM signal.

Although the compression functions of equations (1)–(3) and their complementary expansion functions have been found to be theoretically desirable for non-linear encoding and decoding, the methods and means that have heretofore been developed to carry out such encoding and decoding have not been entirely satisfactory. Indeed, it is believed that the prior art approaches have involved the use of linear encoding and decoding as intermediate steps between the expansion and compression operations of a separate companding process - i.e., the so-called "indirect" method of non-linear encoding and decoding with all of its aforementioned disadvantages. We have, however, developed novel methods and means for so-called "direct" encoding and decoding which may be employed, inter alia, for non-linear encoding and decoding in conformity with the compression functions of equations (1)–(3) and their complementary expansion functions. Thus, the theoretical advantages may be realized, without incurring the disadvantages inherent in the use of a diode compander.

THE BASES FOR A SPECIFIC FORM OF NON-LINEAR ENCODING AND DECODING

Because the specific application of our encoder and decoder to non-linear encoding and decoding of the foregoing type rests in part on the recognition that the compression functions of equations (1)–(3) may be converted to a nonlogarithmic form, it may be helpful to consider that aspect of our invention at this point. To demonstrate the mathematical processes involved, reference is made to the generalized compression function of equation (1), which may be rewritten as follows:

$$\frac{v_0}{V_0}\log_a(C_2+\mu) = \log_a\left(C_1+\mu \frac{v_1}{V_1}\right) \quad (4)$$

This equation can be expressed in terms of multiplicative factors and sums in carrying out the present invention. The logarithms may thus be eliminated to yield:

$$(C_2+\mu)^{\frac{v_0}{V_0}} = C_1+\mu \frac{v_1}{V_1} \quad (5)$$

which, in turn, means that:

$$\frac{V_1}{\mu}(C_2+\mu)^{\frac{v_0}{V_0}} = \frac{V_1C_1}{\mu} + v_1 \quad (6)$$

Now, since there is an integer code step for each PCM code word, it is permissible to define the terms:

- $n$ = the integer code step corresponding to the code word $v_0$; and
- $m$ = the integer code step corresponding to the code word $V_0$. Then, by substitution of those terms, equation (6) becomes:

$$\frac{V_1}{\mu}(C_2+\mu)^{\frac{n}{m}} = \frac{V_1C_1}{\mu} + v_1 \quad (7)$$

which may be rewritten as:

$$\frac{V_1}{\mu} = \left(\frac{V_1C_1}{\mu} + v_1\right)(C_2+\mu)^{\frac{-n}{m}} \quad (8)$$

Equation (8) reveals that the companding function may be obtained via a nonlogarithmic function if the entire term within the first parentheses is taken as the variable input voltage rather than the actual applied voltage. The enclosed term consists of the sum of the applied unknown voltage and a constant voltage equal to the input overload voltage divided by $\mu$. As will be appreciated, equation (8) is a conditional equality which holds true only if the code step n, in fact, corresponds to the code word $\dot{v}_0$. Thus, if

- $\alpha$ = any of the integer code steps, including $n$ and $m$, available for encoding a range of input signals of a given polarity, the following conclusions may be drawn (assuming the overload input voltage $V_1$ takes on the sign of the input signal $v_1$);

$$\frac{V_1}{\mu} = \left(\frac{V_1C_1}{\mu} + v_1\right)(C_2+\mu)^{\frac{-\alpha}{m}}, \text{ if } \alpha = n \quad (9)$$

$$\frac{V_1}{\mu} > \left(\frac{V_1C_1}{\mu} + v_1\right)(C_2+\mu)^{\frac{-\alpha}{m}}, \text{ if } \begin{matrix}[v_1>0 \text{ and } \alpha>n] \\ \text{or} \\ [v_1<0 \text{ and } \alpha<n]\end{matrix} \quad (10)$$

$$\frac{V_1}{\mu} < \left(\frac{V_1C_1}{\mu} + v_1\right)(C_2+\mu)^{\frac{-\alpha}{m}}, \text{if } \begin{matrix}[v_1>0 \text{ and } \alpha<n] \\ \text{or} \\ [v_1<0 \text{ and } \alpha>n]\end{matrix} \quad (11)$$

Inspection of these equations reveals that they are nonlogarithmic functions of the new variable $(V_1C_1 + v_1)/\mu$ and that the only variables are the input signal $v_1$, the code step $\alpha$, and the sign of the full scale input voltage $V_1$. They, therefore, lend themselves to non-linear encoding by means of a successive approximation technique as more fully described hereinbelow.

Of course, the more specialized compression function of equations (2) and (3) may also be converted to nonlogarithmic form by a similar process. In that event, the constants $C_1$ and $C_2$ are both equal to unity and equations (9)–(11) may, therefore, be simplified to yield:

$$\frac{V_1}{\mu} = \left(\frac{V_1}{\mu} + v_1\right)(1+\mu)^{\frac{-\alpha}{m}}, \text{ if } \alpha = n \quad (12)$$

$$\frac{V_1}{\mu} > \left(\frac{V_1}{\mu} + v_1\right)(1+\mu)^{\frac{-\alpha}{m}}, \text{ if } \begin{matrix}[v_1>0 \text{ and } \alpha>n] \\ \text{or} \\ [v_1<0 \text{ and } \alpha<n]\end{matrix} \quad (13)$$

$$\frac{V_1}{\mu} < \left(\frac{V_1}{\mu} + v_1\right)(1+\mu)^{\frac{-\alpha}{m}}, \text{ if } \begin{matrix}[v_1>0 \text{ and } \alpha<n] \\ \text{or} \\ [v_1<0 \text{ and } \alpha>n]\end{matrix} \quad (14)$$

The complementary expansion function for decoding is similarly non-logarithmic. It permits a quantized value of the input signal $v_1$ to be recovered, given no more than the digital code step $n$. The mathematical expression for the expansion function may be derived from the compression function by setting $v_1$ equal to a quantized value $v_{1q}$, $\alpha$equal to $n$, and then solving the encoding equations for the quantized value $v_{1q}$. Thus, referring to equation (9), it will be seen that for the more general case, the expansion function is given by:

$$v_{1q} = \frac{V_1}{\mu}(C_2+\mu)^{\frac{n}{m}} - \frac{V_1C_1}{\mu} \quad (15)$$

Similarly, for the special case, equation (12) yields the expansion function:

$$v_{1q} = \frac{V_1}{\mu}(1+\mu)^{\frac{n}{m}} - \frac{V_1}{\mu} \quad (16)$$

Attention may now be turned to the novel methods and means for encoding and decoding in accordance with our invention, including the multi-stage attenuator that we have developed to implement our invention. The logarithmic compression and expansion functions should, however, be kept in mind since they will be referred to hereinafter in describing one of the specific and very worthwhile applications of our invention.

THE ENCODER - IN GENERAL

Figure 3:
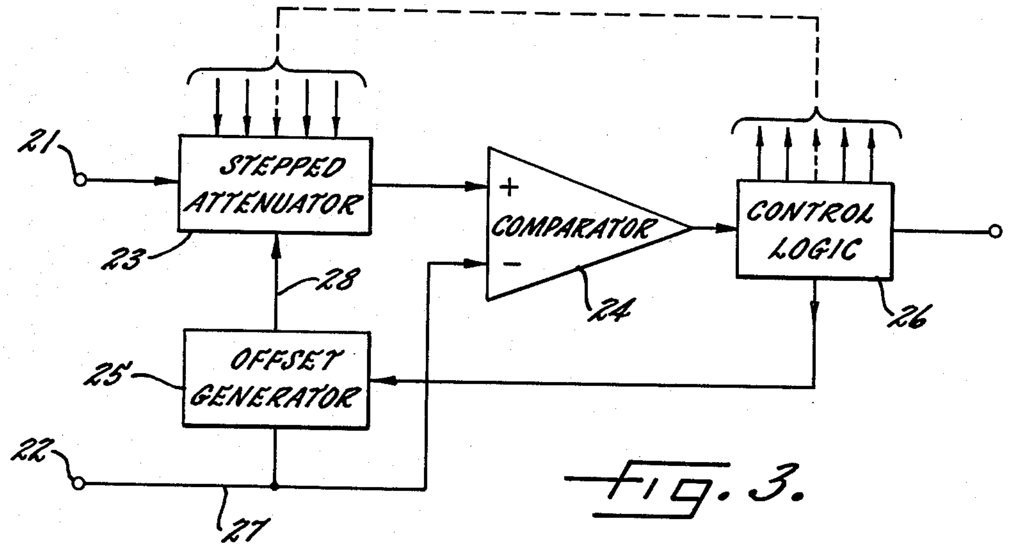
FIG. 3 is a simplified block diagram of an encoder embodying the present invention.

Referring to FIG. 3, it will be seen that we have provided a simple but highly accurate encoder for converting serially applied input signals (PAM samples) into a train of PCM code words. The encoder cycles at the frequency or repetition rate of the samples to provide a separate code word for each sample, and the bits of each code word are generated a bit-at-a-time such that they may be serially fed directly into the digital channel as they are generated. The state of the art permits the encoder to be embodied with very little reactance and it is, therefore, capable of cycling at the frequency and of operating at the digital bit rate required for a 24 channel carrier telephone system such as previously described. Indeed, either or both the cycling frequency and the digital bit rate of the encoder may be increased above the levels dictated by such a system if necessary or desirable for some other application of the encoder.

The encoding involves a successive approximation technique. Specifically, in accordance with the present invention, each input signal or PAM sample is summed with a predetermined reference voltage to obtain a sum voltage which, in turn, is progressively factored by a series of trial divisors K in timed synchronism with the successive weighted time slots of the code word to cause the factored or divided sum voltage to converge on the reference voltage as the bits for the weighted time slots of the code word are generated. The trial divisors are formed from a set of predetermined factors which define possible factors of the sum voltage, and each such factor is associated with and introduced by a respective one of the trial divisors. The objective is to cause the encoder to generage a bit in response to each such trial divisor, with the logic level of the bit digitally indicating whether the factor associated with the particular trial divisor is or is not a factor of the sum voltage. The particular manner in which this objective is achieved depends to an extent on the PCM code format that is selected. For example, if a straight binary code is employed, the amplitude of the sum voltage as divided by each trial divisor is compared against the amplitude of the reference voltage and the bit provided in response to each such trial divisor has a high (1) or low (0) logic level in dependence on whether the amplitude of the divided sum voltage is greater or lesser than the amplitude of the reference voltage. More particularly, if an absolute value plus sign code is employed, the magnitude (or absolute value) of the sum voltage as divided by each trial divisor is compared against the magnitude of the reference voltage such that the bit provided in response to each such trial divisor has a logic level dependent on whether the magnitude of the divided sum voltage is greater or lesser than the magnitude of the reference voltage.

Regardless, however, the code format selected, the trial divisors permit each of the possible factors to be tested during each encoding cycle in a predetermined order and in synchronism with the successive weighted time slots of the code word so that the logic levels of the bits generated for those time slots digitally indicate which of the possible factors are and are not factors of the particular sum voltage. A determination is made for each trial divisor as to whether the factor associated therewith is or is not a factor of the sum voltage. When a positive determination is made the factor is retained for the balance of the encoding cycle to multiplicatively contribute to the trial divisors for the subsequent weighted time slots of the code word. On the other hand, when a negative determination is made, the factor associated with the particular trial divisor is rejected or withdrawn as the encoder advances to the next time slot of the code word and, therefore, has no material effect on any of the trial divisors for the subsequent time slots of the code word. Accordingly, it will be understood that it is the sum voltage ($v_1 + V_1/\mu$) which is factored, and that it is the quantized value of the sum voltage relative to the reference voltage which is carried by the code word. It will also be appreciated that the trial divisors permit the factors of the sum voltage to be accurately identified in sequence because each trial divisor has a value determined by the value of its associated attenuation factor as multiplied by any and all of the other factors that have been previously identified as being factors of the sum voltage. The order in which the possible factors are introduced for testing is important and must be declining weight sequential to keep encoding time to a minimum. The efficiency of encoding is maximized if the factors are introduced in declining order of significance. However, the attenuation of the sum voltage is limited independently of the order selected for introducing the possible factors because no trial divisor so severely reduces or attenuates the sum voltage that the magnitude of the divided sum voltage drops below the magnitude of the reference voltage $V_1/\mu$ by a factor larger than the factor introduced by the particular trial divisor. Thus, the problems encountered in prior encoders with resistive attenuators of excessive attenuation making it difficult, if not impossible to accurately generate the least significant bits of the code words for the weaker signals are overcome. Our encoder is capable of accurately generating even those bits with a high degree of reliability. The transfer function of the encoder - i.e., the manner in which the available code words or code steps are distributed over the range of the input signals (PAM samples) of interest - is principally dependent on the selection of the possible factors of the sum voltage and the selection of the reference voltage magnitude.

More particularly, in the relatively simple embodiment of our encoder illustrated in FIG. 3, the PAM samples are serially applied across the encoder input terminals 21 and 22. The terminal 21 is coupled to the input of an attenuator 23 which has its output coupled to one input, say, the non-inverting input, of a comparator 24. The other or inverting input of the comparator 24 is referenced, together with the other input terminal 22 of the encoder, to some common potential (hereinafter referred to for convenience as ground). There is, however, an offset generator 25 connected between the ground or common bus 27 and the attenuator reference bus 28 for supplying a reference voltage to offset the attenuator reference from ground.

The magnitude of the offset reference voltage for the attenuator 23 is selected, as previously mentioned, to aid in establishing a desired transfer function for the encoder. Its polarity must, however, reflect the polarity of the applied sample to obtain a sum voltage suitable for encoding. Specifically, in the illustrated embodiment, where the reference level for the samples is translated from the common or ground potential to the attenuator reference voltage so that each sample is effectively summed in the attenuator 23 algebraically with the attenuator reference voltage, a negative reference voltage is required for positive samples and a positive reference voltage is required for negative samples. Of course, if the samples are unipolar (all of the same polarity relative to ground), the appropriate polarity for the attenuator reference voltage may be preselected. But, if the samples are bipolar as in the case, for example, in carrier telephone systems, provision must be made to establish the proper polarity for the attenuator reference voltage on a sample-by-sample basis at the outset of each encoding cycle. Even then, however, our encoder has the advantage that no further or other reference voltage or reference current are required.

The encoding is carried out under the control of a logic circuit 26 which is coupled to the output of the comparator 24 and internally clocked at the digital bit rate to advance the encoding process at the bit rate. As will be seen, the logic circuit 26 responds to the polarity of the output signals from the comparator 24 to generate the bits for the code words and to provide the control signals for the encoder. Hence, the comparator 24 is provided with sufficient gain so that the inherent electrical noise at its input is sufficient to preclude its output from stabilizing at zero. Thus, the comparator output signal has only two possible states - positive or negative - and, therefore, may be readily and unambiguously interpreted by the control logic 26.

As will become increasingly apparent, the control logic 26 is reset at the conclusion of each encoding cycle to prepare the encoder for the next cycle. To that end, the control logic then supplies reset signals for the attenuator 23 which cause all of the attenuation factors to be removed therefrom, thereby reducing its effective attenuation level to substantially zero. No further preparation is required for unipolar encoding and the encoder is, therefore, completely conditioned at the outset of each encoding cycle to proceed with the progressive factoring of the next sum voltage as described hereinbelow. But for bipolar encoding, the polarity of the applied sample must first be determined so that the polarity of the attenuator reference voltage can be reversed if necessary to properly reflect the sample polarity. Consequently, in bipolar encoding, the first time slot of each code word is reserved for a sample polarity decision.

Concentrating specifically on bipolar encoding for the moment, it will be seen that in the illustrated embodiments when the control logic 26 is reset it also supplies a control signal for the offset generator 25 which causes the generator to initially supply a negative reference voltage for the attenuator 23. Thus, since the effective attenuation level of the attenuator 23 is substantially zero at the outset of each encoding cycle and since the applied sample and the comparator 24 are both referenced to ground in the embodiment shown in FIG. 3, the polarity of the output signal from the comparator during the first time slot of each code word depends solely on the sample polarity. The control logic may, therefore, respond to the polarity of the comparator output signal to generate an appropriate bit for the first time slot of the code word and, should the applied sample happen to be negative, to provide another control signal for the offset generator 25 to reverse the polarity of the attenuator reference voltage. Hence, by the time the encoder advances to the second time slot of the code word, the appropriate polarity for the attenuator reference voltage has been established and a bit having a high (1) logic level or a low (0) logic level has been inserted into the first time slot of the code word to digitally indicate the polarity of the sample. The encoder is, therefore, conditioned at that time to proceed with the progressive factoring.

The progressive factoring is carried out, for both unipolar and bipolar encoding, by a successive approximation technique. More particularly, the attenuation factors associated with the attenuator 23 are sequentially switched into the attenuator in a predetermined order and in response to control signals supplied by the control logic 26 as the encoding process advances to respective ones of the successive weighted time slots of the code word. As each attenuation factor is switched into the attenuator it multiplicatively contributes to the signal attenuation level thereof. Thus, it will be understood that the attenuation level of the attenuator 23 is incrementally adjusted to provide a series of trial divisors in timed synchronism with the successive weighted time slots of the code word. The control logic 26 responds to the polarity of the output signal from the comparator 24 on a time slot-by-time slot basis to serially insert bits into the weighted time slots of the code word, and the bits provided have logic levels indicating the attenuation factors that may and may not be extracted from the magnitude of the sum voltage without causing it to drop below the magnitude of the attenuator reference voltage. To that end, the control logic 26 is triggered in response to the polarity of the comparator output signal whenever the trial divisor provided for any time slot is so large that the magnitude of the attenuated or divided sum voltage drops below the magnitude of the reference voltage and then provides a further control signal for switching the most recently inserted attenuation factor out of the attenuator 23. Otherwise, the attenuation factors are retained for the balance of the encoding cycle to multiplicatively contribute to the trial divisors for the subsequent weighted time slots of the code word to thereby serially extract from the sum voltage those factors which are identified as being factors which tend to cause its magnitude to converge on the magnitude of the reference voltage. As will be appreciated, the bits carried by the weighted time slots of the code word digitally indicate in factored form the value of a divisor for operating on the sum voltage to cause its magnitude to approximate the magnitude of the attenuator reference voltage.

THE ATTENUATOR

Figure 4:
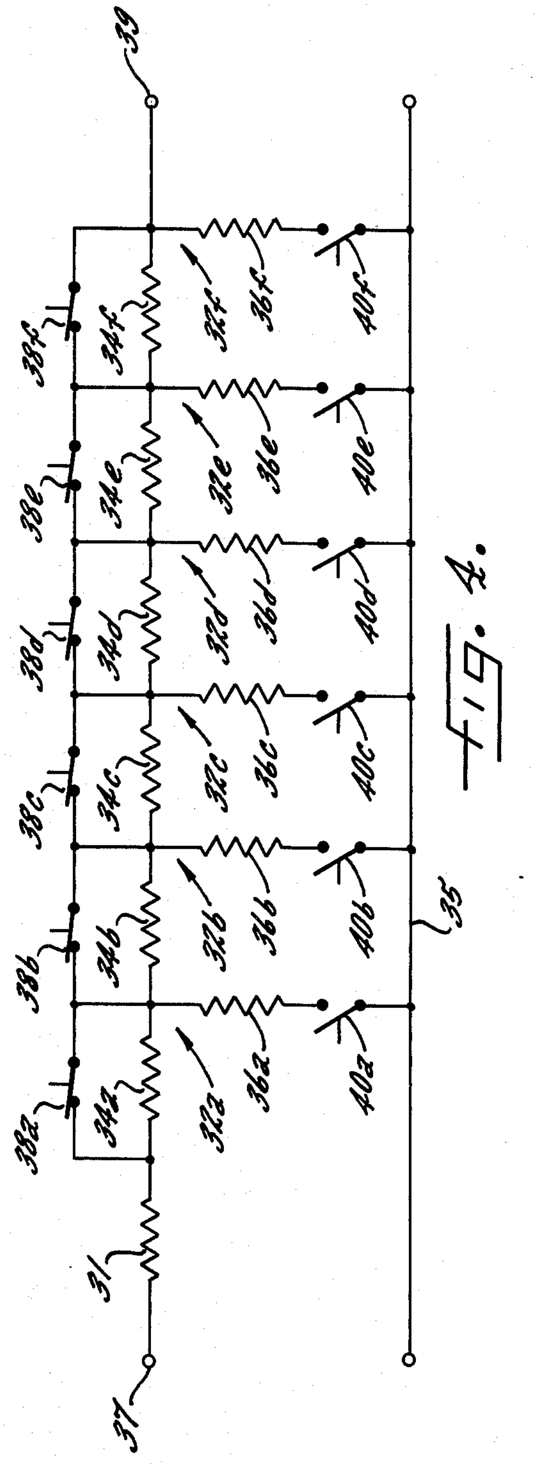
FIG. 4 is a simplified circuit diagram of a multi-stage ladder attenuator useful for encoding and decoding in accordance with this invention.

To implement our encoder, as well as our decoder, we have developed a multi-stage resistive ladder attenuator. Referring to the simplified embodiment of the attenuator shown in FIG. 4 it will be understood that the input signal source has not been shown. Instead, for convenience of analysis it has been assumed that the attenuator is driven by a source with a substantially constant output impedance and that the input resistor 31 is the series equivalent of the input resistance to the attenuator. Hence the input signal for the attenuator may be considered as being supplied by a Thevenin source with an output impedance equal to the input resistor 31. The attenuator, on the other hand, may be viewed as having the resistor 31 and a plurality of stages 32*a–f* connected in series between its input and output terminals 37 and 39.

As illustrated, the attenuator stages 32*a–f* are L-type sections comprised of respective series resistos 34*a–f* and shunt resistors 36*a–f*. Further, there are first and second groups of switches 38*a–f* and 40*a–f*, respectively, which are paired so that each stage has a first switch connected in parallel with its series resistor and a second switch connected in series with its shunt resistor. The switches are operated in pairs to selectively insert and remove the stages 32*a–f*. Specifically, to insert a stage, the switch across its series resistor is opened and the switch in series with its shunt resistor is closed, thereby permitting the stage to function as a voltage divider with a completed return path to the common bus or reference terminal 35 of the attenuator. Contrariwise, to remove a stage, the switch across its series resistor is closed and the switch in series with its shunt resistor is opened, thereby providing a low impedance bypass around the stage and opening the return path for current flow through the stage.

In keeping with an important feature of our attenuator, the stages 32*a–f* are mutually independent so that each of them may be inserted or removed to multiplicatively contribute or withhold a predetermined attenuation factor to or from the overall signal attenuation afforded by the attenuator. To that end, the values of the series and shunt resistors for the successive stages are selected so that the attenuator has a substantially constant output impedance, regardless of whether individual sections happen to be inserted or removed. Consequently, each stage is driven by the equivalent of a Thevenin source since the input impedance to each stage is substantially constant. Hence, the attenuation factor for each stage is simply the ratio of its shunt impedance to the sum of its input impedance, its series impedance, and its shunt impedance. Moreover, the attenuation factors of the stages which are inserted into the attenuator multiplicatively combine because each such stage multiplies the input signal by its voltage dividing ratio or attenuation factor before applying the signal to the next stage. Similarly, the attenuation factors of the stage which are removed from the attenuator are withheld because each such stage applies the input signal to the next stage without reducing its amplitude. Thus, it will be appreciated that the attenuator is capable of providing a number of different attenuation levels, ranging from substantially none at all when all of its stages are removed to an attenuation substantially equal to the product of the attenuation factors of its several stages when all of its stages are inserted. Furthermore, it will be understood that the attenuator may, at least theoretically, comprise any desired number of stages, with the only limit being the error that may tend to accumulate if the output impedances of the stages are not, in fact, precisely constant. The "error" of concern is, of course, the difference between the actual attenuation afforded by the attenuator and the desired attenuation as determined by the product of the attenuation factors assigned to the stages that are inserted.

The conditions for maintaining the output impedances of the stages of our attenuator constant may be roughly approximated by selecting the values of the series and shunt resistors for each stage so that the output impedance from each stage is the sum of the input impedance and its series resistor in parallel with its shunt resistance. That, however, permits only a rough approximation of the desired conditions because it does not take into account the fact that in practice each of the switches 38*a–f* and 40*a–f* generally presents a finite impedance when closed. Accordingly, to minimize the variations in the output impedances of the stages so as to reduce the aforementioned error, we recommend that allowance be made for the finite switch impedance.

The attenuation factors for the stages of the attenuator may be selected independently of the requirements for maintaining the output impedances of the stages constant. More particularly, the attenuation factor or voltage dividing ratio for any given stage depends on the ratio of its shunt resistance (the sum of its shunt resistor and the finite impedance of the switch in series therewith) to the sum of its input impedance, shunt resistance and series resistor (the open circuit impedance of the switch across the series resistor may be neglected). The value of that voltage dividing ratio does not impose any appreciable constraint on the output impedance presented by the stage when it is inserted since the output impedance is simply the sum of the input impedance to the stage and its series resistor in parallel with its shunt resistance. Thus, the attenuator may be readily tailored to afford just about any desired set of different attenuation levels by the selection of the attenuation factors for its stages.

AN IMPROVED ENCODER

Turning now to a more detailed consideration of our encoder, it will be understood that the basic embodiment shown in FIG. 3 carries out the encoding such that the code step changes (changes from one code word to the next) occur at those points at which the sum of the sample and reference voltages equals one or another of the discrete signal levels represented by the code. In other words, the encoder decision points precisely correspond to the quantized values the code is capable of transmitting. As a general rule, that is not a particularly desirable condition. It does not permit the quantization distortion to be minimized because the difference between the actual and quantized values for any given sum voltage may be as large as the subrange into which the sum voltage happens to fall. And, in bipolar encoding, the correspondence of the encoder decision points to the quantized values comprised by the code creates an ambiguity because there is a code step change centered on zero, with the result that the very small positive and negative samples which have magnitudes less than the weight assigned to the least significant bit of the code word are encoded as zero but by two different code words, one having a sign bit indicating the polarity of the positive samples and the other having a sign bit indicating the polarity of the negative samples. Usually the distinction provided by the two code words between positive and negative zero is valueless.

Thus, we prefer to include provision in the encoder for shifting the code step changes so that they do not coincide with the discrete signal levels of the code. Specifically, we recommend that the code step changes be displaced from the discrete signal levels of the code by one-half the value of the least significant bit of the code word. Under those conditions, the quantized value for any given sum voltage substantially corresponds to the midpoint value of the subrange into which the sum voltage (the voltage to be encoded) happens to fall. Also, only one code word is required for encoding the very small positive and negative voltages as zero.

Figure 5:
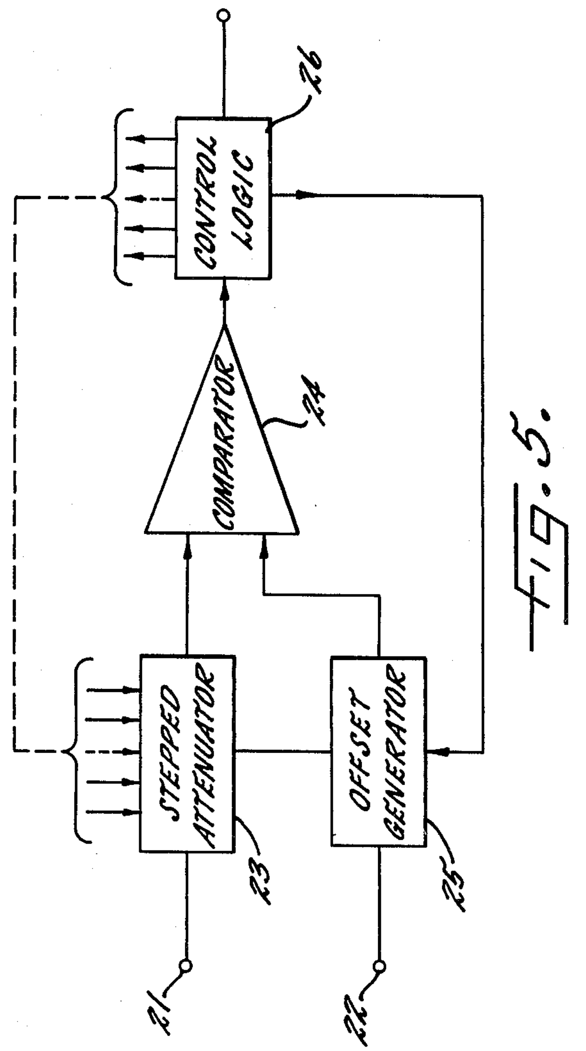
FIg. 5 is a simplified diagram of a modified encoder similar to the one shown in FIG. 3, but including provision for shifting the code step changes by ½ step interval volts relative to the reference level for the input signals to be encoded so that the quantized value for any given subrange substantially corresponds to the mid-point value of the subrange.

In the modified embodiment of our encoder shown in FIG. 5, the code step changes (the encoder decision points) are shifted by applying a small offset voltage to the inverting or reference input of the comparator 24.

The magnitude of this small offset voltage determines the amount of displacement between the code step changes and the discrete signal levels of the code since it offsets the comparator reference from the common or ground potential for the encoder. Thus, in keeping with our recommended displacement, a suitable offset voltage may have a magnitude equal to one-half the value of the least significant bit or, in other words, equal to simply ½ bit. The offset voltage for the comparator may, as shown, be supplied by the offset voltage generator 25 so that its polarity reverses with the polarity of the offset voltage for the attenuator 23. Alternatively, the offset voltage for the comparator may have a fixed polarity and be supplied by a second source. In either event only a single code word is required for encoding very small positive and negative sum voltages as zero. Specifically, if a ½ bit offset voltage with, say, a negative polarity is employed, sum voltages between the −½ bit and the +½ bit levels are encoded as zero with a positive sign bit. Similarly, sum voltages between the +½ and +1½ bit levels cause the +1 code word to be transmitted, voltages between the −½ and −1½ bit levels cause the −1 code word to be transmitted, and so forth, with each code step change being offset by ½ bit from the code word values or discrete signal levels comprised by the code.

In passing, it should be noted that there are certain practical advantages obtained by having the polarity of the comparator offset voltage reverse with the polarity of the attenuator offset voltage. For example, in the specific implementation of our encoder described hereinbelow, each encoding cycle begins with the comparator reference offset by a negative ½ bit voltage and the control logic outputs a high level bit (1) whenever the comparator output signal is positive and a low level bit (0) whenever the comparator output signal is negative. Thus, if the polarity of the comparator offset voltage is fixed, the encoder tends to generate an all zeroes code word (0000000) in response to any sum voltage between the −½ and −1½ bit levels. Frequently, it is desirable to suppress or eliminate the all zeroes code word in the interest of maintaining a decoder in synchronism with the encoder. That may be accomplished in an offset binary encoding format using known techniques by including means (not shown) in the control logic 26 for generating, regardless of the polarity of the comparator output signal, a high level bit (1) for the last pulse position of any code word having low level bits (0) in all of its preceding pulse positions. However, in an absolute-value-plus-sign encoding scheme, it is necessary to suppress the all zeroes code word by reversing the offset voltage with the attenuator offset voltage for those sum voltages which are lower than the −½ bit level and which are, therefore, encoded with a sign bit of 0. Specifically, if the polarity of the comparator offset voltage follows that of the attenuator offset voltage, all sum voltages above the −½ bit level are encoded to provide code words with positive (1) sign bits and all sum voltages below that level are encoded to provide code words having one or more high level (1) bits in their weighted pulse positions or time slots.

A SPECIFIC EMBODIMENT OF THE ENCODER

Figure 6:
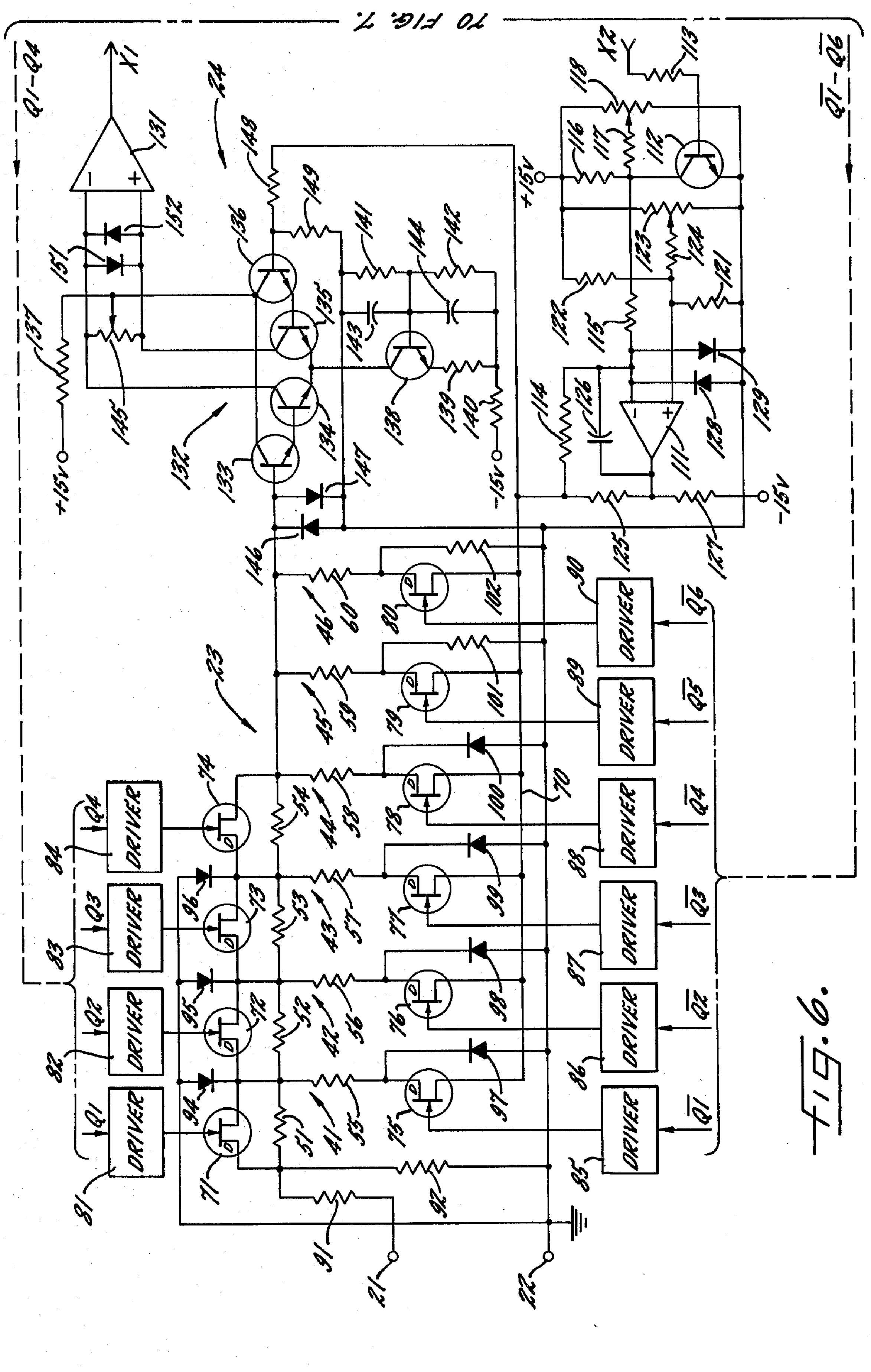
FIG. 6 is a circuit diagram of one implementation of the encoder shown in FIG. 5.
Figure 7:
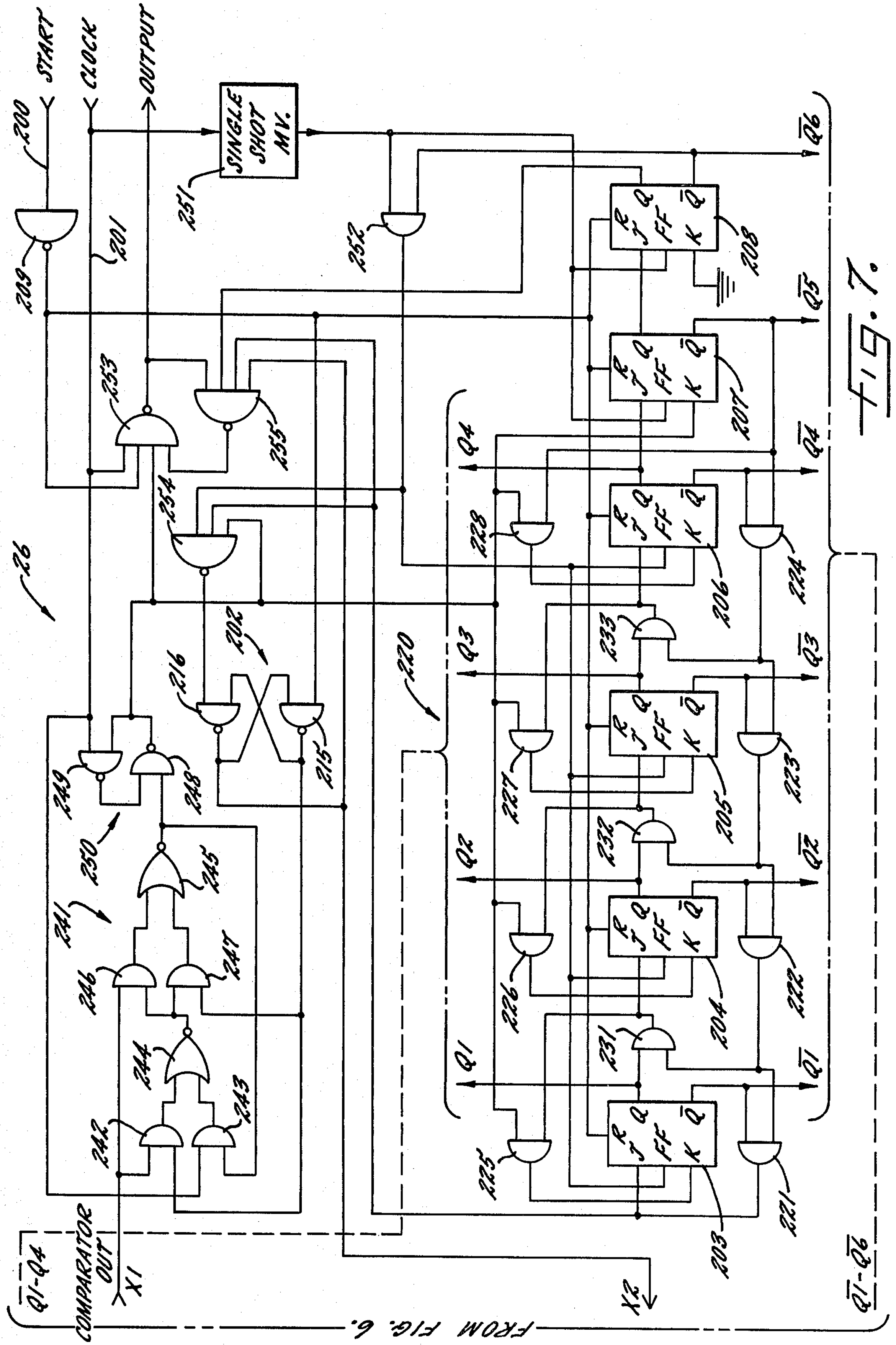
FIG. 7 is a diagram of a logic circuit for controlling the encoder of FIG. 6 to provide an absolute value plus sign code format.

With the foregoing in mind attention is directed to FIGS. 6 and 7 for a discussion of a specific embodiment of our encoder. As will be seen, FIG. 6 is a simplified circuit diagram of the front end of the encoder shown in FIG. 5, while FIG. 7 is a diagram of a suitable logic circuit for carrying out the encoding with an "absolute value plus sign" type PCM code format. Further, the embodiment illustrated by FIGS. 6 and 7 is specific to bipolar encoding with seven time slots per code word and is, therefore, suitable for describing the specific application of an encoder to non-linear encoding in, say, a 24 channel carrier telephone system characterized by a channel sampling rate of 8KHz. and a digital channel bandwidth of about 1.5MHz.

As will be recalled, a suitable transfer function for the encoder in applications to carrier telephony is the function previously discussed in connection with equations (12)–(14). The seven time slots allotted to each code word provide one hundred twenty-seven code steps; one for encoding the very small positive and negative sum voltages as zero, 63 for encoding the larger positive sum voltages, and another 63 for encoding the larger negative sum voltages. One additional code word comprised of all zeros is suppressed. The transfer function of the encoder is tailored to the compression function of equations (12)–(14) by selecting $V_1/\mu$ as the magnitude for the attenuator offset or reference voltage and by extracting successive square roots (including the first) of the function $$(1+\mu)^{\frac{m+x}{m}}$$

where $x$=the number of suppressed code steps, as the attenuation factors. Hence, it will be understood that both the attenuator offset voltage and the attenuation factors depend on predetermined constants. For example, in a typical application of our encoder to non-linear encoding in a carrier telephone system the full scale or overload sample voltage $V_1$ is three volts, the code step $m$ for the full scale code word is 63, one code step is suppressed, and the companding constant $\mu$ is 100. These typical values yield an attenuator offset reference voltage magnitude of thirty millivolts and, in declining order of significance, attenuation factors of $101^{32/63}$, $101^{16/63}$, $101^{8/63}$, $101^{4/63}$, $101^{2/63}$ and $101^{1/63}$.

The non-linear encoding is carried out in substantially the same manner as previously described for the more general case. The input signals or PAM samples are serially applied to the encoder input terminals 21 and 22, the latter being grounded so that all samples are referenced to ground. To accommodate bipolar samples, the first time slot of each code word is reserved for a sign bit which is generated by the control logic 26 in response to the polarity of the output signal provided by the comparator 24 when all attenuation factors are removed from the attenuator 23 and when the offset generator 25 is set to offset the attenuator reference from ground by $-V_1/\mu$ volts and to offset the inverting input of the comparator from ground by −½ the value of the smallest discrete signal level comprised by the code (hereinafter referred to as −½ bit volts). The sign bit is, therefore, high (1) or low (0) depending on whether the sample is more positive or more negative than the −½ bit level. Once the polarity of the sample has been determined, the control logic 26 signals the offset generator 25 to establish the appropriate polarity for the offset voltages and then signals the attenuator 24 to sequentially insert and selectively remove its attenuation factors so as to progressively factor the sum of the sample and reference voltages as the bits for the weighted pulse positions of the code word are generated. The order in which the attenuation factors are inserted is important to minimize the encoding time. That is, the attenuation factors must be inserted in timed synchronism with their correspondingly weighted code word in declining weight sequential time slots so that the quantized value for the sum of the sample and reference voltages may be recovered from the code word. The order in which the attenuation factors are inserted is important because the minimum encoding time is obtained when succeeding trial divisors are square roots of the previous trial divisor. Accordingly, the attenuation factors are usually inserted into the attenuator in declining order of significance.

More particularly, as illustrated in FIG. 6, the attenuator 23 comprises six stages 41–46. The first four stages 41–44 are L-type sections with respective series resistors 51–54 and shunt resistors 55–58, while the last two stages are simpler shunt sections comprised of respective shunt resistors 59 and 60. Significant cost savings are realized by employing shunt sections rather than L-type sections for the last two stages, but the ability to maintain the output impedances of those sections constant as they are inserted into and removed from the attenuator is sacrificed. However, it should be noted that variations in the output impedance of the final stage 46 of the attenuator are immaterial because its output impedance does not affect the input impedances or attenuation factors of any other stage. Variations in the output impedance of the fifth stage 45 cannot, however, be so conveniently discounted because such variations do represent variations in the input impedance to the final stage and, therefore, cause its attenuation factor to change. Hence, the fifth stage 45 should also be an L-type section unless, as here, the errors resulting from variations in the output impedance of that stage are so small that they may be tolerated. Specifically, as shown, the attenuator stages 41-46 are weighted in declining order of significance in accordance with the successive square roots of the function $$\frac{m+x}{m}_{(\mu+1)}$$

Hence, the error caused by employing a shunt section instead of an L-type section for the fifth stage of the attenuator is less than 1 percent for $\mu = 100$, $m = 63$ and $x = 1$. It will, therefore, be appreciated that the stages 41-46 are substantially independent such that the overall attenuation level afforded by the attenuator at any given time is substantially equal to the product of the attenuation factors of those stages which are inserted into the attenuator at that time.

The stages 41–46 are selectively switched into and out of the attenuator 23 under the control of the logic 26 by means of field effect transistors 71–80 which are driven by respective driver circuits 81–90. The savings that are realized by employing shunt sections for the last two attenuator stages should be apparent. Specifically, each of the first four stages 41–44 requires a pair of field effect transistors, one in parallel with its series resistor and the other in series with its shunt resistor, whereas each of the last two stages requires only one field effect transistor in series with its shunt resistors.

The attenuator stages are returned to the attenuator reference bus via their respective shunt resistors 55–60 and series connected field effect transistors 75–80. They are, therefore, basically voltage dividers. Specifically, the voltage dividing ratio of each of the L-type sections 41–44 depends on the ratio of its shunt resistance to the sum of its input impedance, series resistance and shunt resistance. On the other hand, the voltage dividing ratio of each of the shunt sections 45 and 46 depends on the ratio of its shunt resistance to the sum of its input impedance and shunt resistance. Thus, to insert one of the L-type sections into the attenuator, the field effect transistor across its series resistor is switched out of conduction while the field effect transistor in series with its shunt resistor is switched into conduction. Contrariwise, to remove one of the L-type sections, the field effect transistor across its series resistor is switched into conduction while the field effect transistor in series with its shunt resistor is switched out of conduction. On the other hand, each of the shunt sections is inserted into and removed from the attenuator as the field effect transistor in series with its shunt resistor is switched into and out of conduction.

The field effect transistors 71–80 are switched between the nonconductive states and their states of conduction, so that each of them is either fully "off" or fully "on." The source-drain impedance presented by any one of the field effect transistors when it is in the non-conductive state is so high that it may, as a general rule, be ignored. The converse does not, however, usually hold true of the relatively low impedance exhibited by the source-drain circuit of the same field effect transistor when it is in conduction. Rather, the source-drain circuits of the conductive field effect transistors have finite "on" impedances, and allowance should be made for such impedances in selecting the values for the series and shunt resistors 51–54 and 55–60 of the attenuator. Preferably, the field effect transistors 71–80 have substantially the same "on "impedances so that a single, nominal value thereof may be employed, together with the attenuation factors selected for the respective stages of the attenuator, to ascertain the optimum values for the series and shunt resistors 51–54 and 55–60.

A suitable procedure for calculating the values for the series and shunt resistors of the L-type sections or stages 41–44 is to first determine the optimum output impedances for those sections. The optimum output impedance for any one of them may be determined by summing the input impedance to the attenuator with a compensating factor obtained by multiplying the nominal "on" impedance of the field effect transistors by one plus the number of preceding stages. That is, $$Z_{oj} = Z_i + Z_F\,(y + 1) \tag{18}$$

where $Z_{oj}$ = the output impedance of the jth stage of the attenuator;

$Z_i$ = the input impedance to the attenuator;

$Z_F$ = the nominal "on" impedance of the field effect transistors; and y = the number of attenuator stages preceding the jth stage.₁ Having determined the output impedances for the L-type sections, a pair of simultaneous equations may be solved to yield appropriate values for the series resistor and shunt resistance of any given one of those stages. One of the simultaneous equations is obtained by setting the output impedance for the given stage equal to the sum of its input impedance and series resistor in parallel with its shunt resistance such that the equation is:

$$Z_{oj} = \frac{(Z_{ij} + R_{1j})(R_{2j})}{Z_{ij} + R_{ij} + R_{2j}} \qquad (19)$$

where $Z_{ij}$ = the input impedance to the jth stage of the attenuator;

$R_{1j}$ = the value of the series resistor in the jth stage; and $R_{2j}$ = the value of the shunt resistance in the jth stage. Of course, the input impedance $Z_{ij}$ to the jth stage of the attenuator is simply the output impedance of the preceding stage or, in the case of the first stage 41, the input impedance to the attenuator. The other of the simultaneous equations is obtained by setting the attenuation factor assigned to the given stage equal to the ratio of shunt resistance for the stage to the sum of its series resistor and shunt resistance - i.e., $$A_j = \frac{R_{2j}}{R_{1j} + R_{2j}} \qquad (20)$$

where $A_j$ = the preselected attenuation factor for the jth stage of the attenuator. Finally, the value for the shunt resistor of the given stage may be determined by subtracting the nominal "on" impedance of the field effect transistors from the calculated shunt resistance value -

$$R_{3j} = R_{2j} - Z_F \qquad (21)$$

where $R_{3j}$ = the value for the shunt resistor in the jth stage of the attenuator.

The fifth and sixth stages 45 and 46, being shunt-type sections, permit an even more straightforward calculation of the appropriate values for their respective shunt resistors 59 and 60 since there is only one unknown per stage. The output impedance of the final L-type section, in this case the fourth stage 44, is not only the input impedance to the fifth stage 45 but also a reasonably close approximation of the input impedance to the sixth stage 46. Hence, the shunt resistance for a given one of the shunt sections may be calculated by setting the attenuation factor for that section equal to the ratio of the shunt resistance of the section to the sum of the output impedance of the final L-type section plus the shunt resistance -

$$A_j = \frac{R_{2j}}{Z_o + R_{2j}} \qquad (22)$$

where $Z_o$ = the output impedance of the final L-type section of the attenuator. The optimum value for the shunt resistor of the given stage may then be determined by solving that equation for the shunt resistance and by then subtracting the nominal "on" impedance $Z_o$ from the shunt resistance obtained.

As will be appreciated, the foregoing procedure is of general applicability regardless of the attenuation factors selected for the respective stages of the attenuator. It not only applies to the specific attenuation factors that are used to tailor the transfer function of our encoder to the particular compression function discussed in connection with equations (12)-(14), but also to any other set of attenuation factors that may be selected.

As will be seen, provision is made to prevent the field effect transistors 71–80 from drawing appreciable gate current in the interest of preserving the encoding accuracy. Specifically, the maximum forward gate bias applied to the field effect transistors is limited to just a few tenths of a volt. To that end, as shown, a pair of resistors 91 and 92 are connected across the encoder input terminals 21 and 22 to form a voltage divider, and the voltage dividing ratio is selected to limit the maximum magnitude of the PAM samples applied to the attenuator 23 to a suitably low level of, say, three volts. The resistors 91 and 92, of course, are major determinents of the output impedance of the encoder driver or signal source (not shown), with the additional advantage that the parallel resistance is independent of their ratio to aid in establishing a suitable input impedance for the attenuator. We have found that an attenuator input impedance of about five hundred ohms is satisfactory for application of our encoder to non-linear encoding in carrier telephone systems such as previously described.

Another generally undesirable characteristic which has been taken into account is the tendency of the field effect transistors 71–80 to produce transients as they are switched into and out of conduction. Generally, to step or adjust the attenuation level of the attenuator 23 in timed synchronism with the code word time slots, very rapid switching of the field effect transistors is required. Thus, the driver circuits 81–90 supply very sharp control pulses for abruptly changing the gate voltage levels of their respective field effect transistors between, say, about −15 volts and about 0 volts so that the rapid switching is achieved. At the present state of the art, such abrupt, step-like gate voltage transitions are responsible for unavoidable switching transients because available field effect transistors have inherent gate-drain capacitance. We, therefore, include means for disabling the control logic 26 during the initial segment, specifically the first half or so, of each time slot of each code word as described more fully hereinbelow to provide a brief settling time for the transients to dampen to a tolerable level. The duration of the settling time, of course, dictates the provision required to achieve the desired degree of transient damping and, indeed, may lead to the selection of different means for different ones of the field effect transistors. For example, as shown, the drain of the field effect transistor 71 is returned to ground by the resistor 92. If it is assumed that the resistor 92 has a fairly small value, it will be understood that no further provision is required to dampen the transients produced by the field effect transistor 71 in response to either the positive or negative going transition of its gate voltage. The drains of the field effect transistors 72–74 are respectively returned to the attenuator reference bus 70 via the shunt resistors 55–57 and the field effect transistors 75–77. It is again assumed that the shunt resistors 55–57, as well as the shunt resistor 58, are sufficiently small that the time constant associated with the source-drain capacitances of the field effect transistors 72–78 are sufficiently short to provide adequate transient damping. Regardless, however, of the values of the shunt resistors 55–58, the field effect transistors 75–78 connected in series therewith may prevent effective damping of negative-going transients. Thus, the drains of the field effect transistors 72–78 are returned to ground via respective diodes 94–100 which are poled to clip the negative-going transients. Finally, it has been assumed that the shunt resistors 59 and 60 are too large to provide the desired degree of transient damping within the available settling time. Consequently, their drains are returned to ground via respective resistors 101 and 102 to obtain the desired transient damping at the expense of accepting some error in the weighting and control of the last two attenuator stages. Of course, if the stages are weighted in declining order of significance, the two least significant attenuation factors are assigned to the last two attenuator stages and the error caused by the resistors 101 and 102 is then only very slight. We have found that adequate damping is achieved if the switching transients are reduced to 70 dB, during the available settling time, below the full input signal level.

The offset generator 25 is a reversible polarity, fixed magnitude voltage source which supplies the offset voltages for the attenuator 23 and the comparator 24 under the control of the control logic 26. The magnitude of the output voltage from the offset generator is preferably selected to equal the magnitude of the larger of the two offset voltages, so that a simple voltage divider or the like may be employed to derive the other offset voltage. Thus, for non-linear encoding in accordance with the aforementioned logarithmic compression function, the offset generator 25 has its output connected to the attenuator offset bus 70, and its output voltage magnitude is selected to equal the $V_1/\mu$ volts magnitude of the offset or reference voltage required by the attenuator.

More particularly, as shown, the offset generator 25 comprises an operational amplifier 111 which is biased so that its output voltage polarity rapidly reverses as a transistor 112 is switched between its non-conductive state and its state of saturated conduction by control pulses supplied by the control logic 26. A suitable control logic, including means for supplying the control pulses for the offset generator, is described in the following section hereof. For now it suffices to note that the control pulses are applied to the base of the transistor 112 through a current limiting resistor 113. The operational amplifier is connected in an inverting mode and includes the usual feedback resistor 114 between its output and inverting input terminals. A bias voltage is, however, applied to its non-inverting input to set the offset voltage to a predetermined value for encoding negative voltages. The bias voltage also compensates for the small current which flows into the operational amplifier 111 when transistor 112 is saturated. Specifically, the operational amplifier 111 has its inverting input connected by an input resistor 115 to the collector of the transistor 112 which, in turn, has its emitter returned to ground. The collector of the transistor 112 is connected by a load resistor 116 to a suitable positive bias supply and by a resistor 117 to the midpoint of a potentiometer 118, which is connected between the bias supply and ground. On the other hand, the non-inverting input of the operational amplifier 111 is returned to ground through a resistor 121 and is also connected to the bias supply by a resistor 122. Further, connected between the bias supply and ground there is another potentiometer 123 which, in this instance, has its slider connected by a resistor 124 to the upper or non-grounded end of the resistor 121. Consequently, to fix the magnitude of the output voltage from the offset generator, the values of the fixed resistors 114-117, 121, 122 and 124 are first selected so that the desired output voltage magnitude is at least approximated for both the positive and negative polarity cases. Then, the potentiometer 123 is adjusted while the transistor 112 is in saturation to trim the positive polarity output voltage so that the attenuator reference bus, is say, $+V_1/\mu$ volts above ground. After that, the transistor 112 is switched out of conduction and the negative polarity output voltage is then trimmed by adjusting the potentiometer 118 until the voltage between the attenuator reference bus 70 and ground reaches the mirror image, complementary negative level $-V_1/\mu$ volts.

As will be understood, the load on the offset generator 25 changes rapidly as stages are inserted into and out of the attenuator 23 and there is an appreciable capacitive load component due to the inherent capacitance of the field effect transistors 71–80. It is, therefore, desirable that the operational amplifier 111 be a wideband amplifier to insure that the output voltage from the offset generator remains constant despite its rapidly changing load. But, the use of a wideband amplifier requires that provision be made to prevent it from being de-stabilized by the capacitive load component. Hence, our operational amplifier 111 includes an output resistor 125 to buffer the capacitive load and a feedback capacitor 126 to provide a high frequency feedback path between its output and inverting input terminals. The high frequency feedback path via the capacitor 126 decreases both the response time and the settling time of the wideband amplifier, while the buffering effect of the resistor 125 decreases or smooths the apparent load variations. As will be seen, the output resistor 125 is included in the feedback path defined by the resistor 114 and the output of the offset generator is taken from the junction between those two resistors. Thus, the value of the output resistor 125, as well as the value of the capacitor 126, affect the closed loop response of the operational amplifier 111, although their values are preferably selected to have only a minimal effect so as to simplify the trimming of the offset generator output voltage magnitude as previously described.

The load on the offset generator 25 when a negative output voltage is required may exceed the negative current capability of the operational amplifier 111. In that event, rather than draw the additional negative current through the operational amplifier from a compensating source (not shown), we prefer that the current be drawn externally from a suitable negative bias supply via resistor 127 connected between the bias supply and the output of the amplifier. This arrangement reduces the power dissipation within the amplifier. Also, to protect the operational amplifier 111, it is advisable that its inverting input be returned to ground by a pair of parallel connected, oppositely poled diodes 128 and 129 so as to prevent the amplifier from being overdriven by the transients which may appear when power is first applied.

The comparator 24 must have a very fast response time since it carries out a separate comparison for each time slot of the PCM code word. The response time requirements could possibly be met directly without overloading the attenuator 23 by a specially designed differential amplifier-type comparator characterized by low input current requirements. We, however, prefer to avoid the additional expense and design problems such an amplifier might entail. Hence, the comparator shown comprises a conventional differential amplifier-type comparator 131, together with a differential-type current amplifier 132.

The differential amplifier buffers the comparator 131 with its high input current requirements from the attenuator 23. To provide a high degree of isolation, we prefer a Darlington-type differential amplifier with a constant current drain. Thus, as shown, the differential amplifier 132 includes first and second pairs of Darlington connected transistors 133, 134 and 135, 136, respectively. The Darlington pairs have the collectors of their respective input transistors 133 and 136 connected together to a suitable positive bias supply by a common collector load resistor 137. Further the emitters of their respective output transistors 134 and 135 are tied together and through the collector-emitter circuit of a transistor 138, a bias resistor 139, and a de-coupling resistor 140 to a suitable negative bias supply. The transistor 138 has its base connected to the junction between a pair of resistors 141 and 142 which extend from the de-coupling resistor 140 to ground. The values of the resistors 141 and 142 are selected, together with the value of the resistor 139, so that the transistor 138 operates as a constant current drain, such that the sum of the currents drawn by the Darlington pairs 133, 134 and 135, 136 is essentially constant. To prevent the bias on the transistor 138 from being upset by noise voltages that may be present, respective bypass capacitors 143 and 144 are coupled in parallel with the resistors 141 and 142.

An important reference level translation takes place between the attenuator 23 and the differential amplifier 132. The attenuator is referenced to the reference or offset voltage on the bus 70, whereas the differential amplifier is referenced to ground. As a result, the algebraic value of the attenuator reference voltage is effectively subtracted from the attenuated sum voltage such that the differential amplifier 132 responds to the sense of the difference between the absolute value of the attenuated sum voltage and the absolute value of the reference voltage. More particularly, the base of the transistor 133 is connected to the output of the attenuator 23. To protect that transistor from being overdriven, its base may be returned to ground through a pair of parallel connected, oppositely poled diodes 146 and 147. The diodes 146 and 147 provide further transient protection by clipping the switching transients which may appear at the output of the attenuator and are especially desirable when the available settling time is very short. The base of the transistor 136, on the other hand, is connected to the junction between a pair of resistors 148 and 149 which extend from the attenuator reference bus 70 to ground. The resistors 148 and 149 form a voltage divider with a dividing ratio which is selected to give the ½ bit volts comparison reference for making mid-subrange decisions.

There is a potentiometer 145 which has its opposite ends respectively connected to the collectors of the output transistors 134 and 135 of the differential amplifier 132 and its slider connected through the load resistor 137 to the positive bias supply. The potentiometer is, therefore, effectively divided by its slider to provide respective collector load resistors for the transistors 134 and 135. Hence, the comparator 131 responds to the differential output of the differential amplifier 132 since its non-inverting and inverting inputs are respectively connected to the collectors of the transistors 134 and 135. As will be understood, the potentiometer 145 may be adjusted to compensate not only for slight mismatches between the transistors 133–136, but also for the input offset of the comparator 131. The objective is, of course, to balance the input to the comparator 131 such that its output reverses polarity when the difference between the absolute value of the attenuated sum voltage and the absolute value of the reference voltage are just equal. For example, if it is assumed for the sake of simplicity that the transistors 133–136 are perfectly matched and that the comparator 131 has no input offset so that the proper balance can be achieved by centering the slider of the potentiometer 145, the illustrated comparator 24 will exhibit the following characteristics. If the sum voltage exceeds the reference voltage, the greater portion of the constant current requirement of the transistor 138 is supplied by current drawn through the transistors 133 and 134 of the first Darlington pair. The voltage at the collector of the transistor 135, therefore, exceeds the voltage at the collector of the transistor 134, with the result that the output from the comparator 131 is low. In contrast, if the reference voltage exceeds the sum voltage, the major portion of the current requirement of the transistor 138 is satisfied by current flow through the transistors 135 and 136 of the second Darlington pair. The voltage at the non-inverting input of the comparator 131 then exceeds the voltage at its inverting input such that the output from the comparator is high.

As will be seen, there are another pair of oppositely poled diodes 151 and 152 connected in parallel between the inverting and non-inverting inputs of the comparator 131 for limiting the differential output from the differential amplifier 132. The limiting action afforded by the diodes is beneficial because it reduces the settling time required by the comparator. Also, the comparator 131 is operated in an open loop configuration such that its characteristically high open loop gain, together with the gain of the differential amplifier 132, is more than ample to insure that the inherent electrical noise in the encoder will suffice to virtually preclude the output of the comparator from stabilizing at a non-digital level. Such an output from the comparator is undesirable since it could not be unambiguously interpreted by the control logic 26.

CONTROL LOGIC FOR ABSOLUTE VALUE PLUS SIGN ENCODING

There are very few constraints on the control logic for our encoder. For bipolar encoding, the first time slot of each code word is reserved for a sign bit and any necessary adjustment of the polarity of the output voltage from the offset generator 25 is accomplished during that time slot. Otherwise, a variety of PCM code formats may be utilized, including a straight binary code (if a straight binary code is selected, the comparator offset voltage should remain fixed). The code format we prefer, however, is perhaps best characterized as an "absolute value plus sign code," by which we mean that each code word comprises a sign bit to digitally indicate the polarity of the encoded signal, followed by a plurality of weighted bits to digitally indicate the magnitude (or, in other words, the absolute value) of the encoded signal. An absolute value plus sign code is believed to be somewhat simpler to process and decode than others.

Figure 8A:
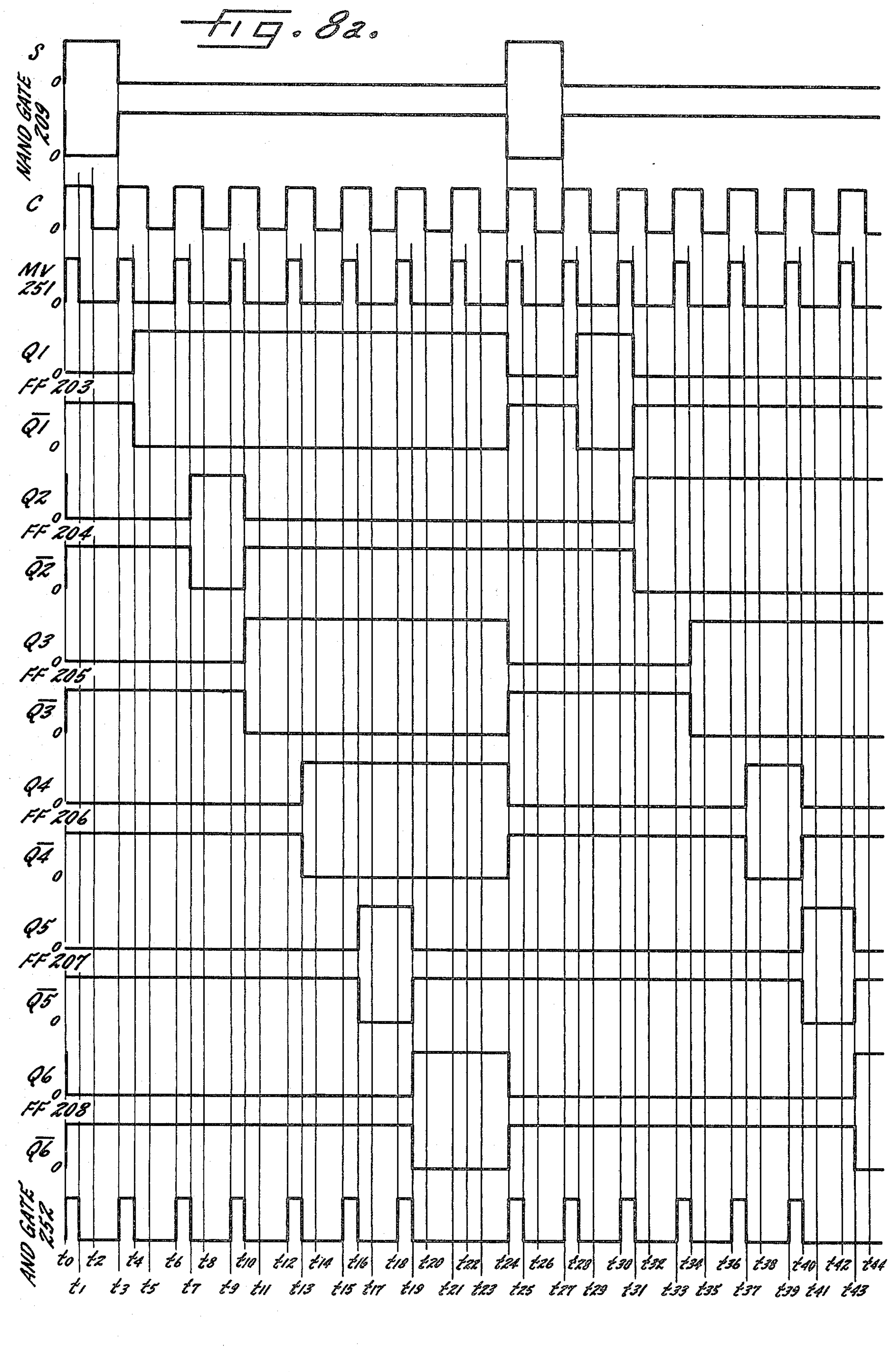
FIGS 8*a*–8*c*, when taken together, form a timing chart illustrating the operation of the logic circuit shown in FIG. 7 during the encoding of both a positive and a negative sample.
Figure 8B:
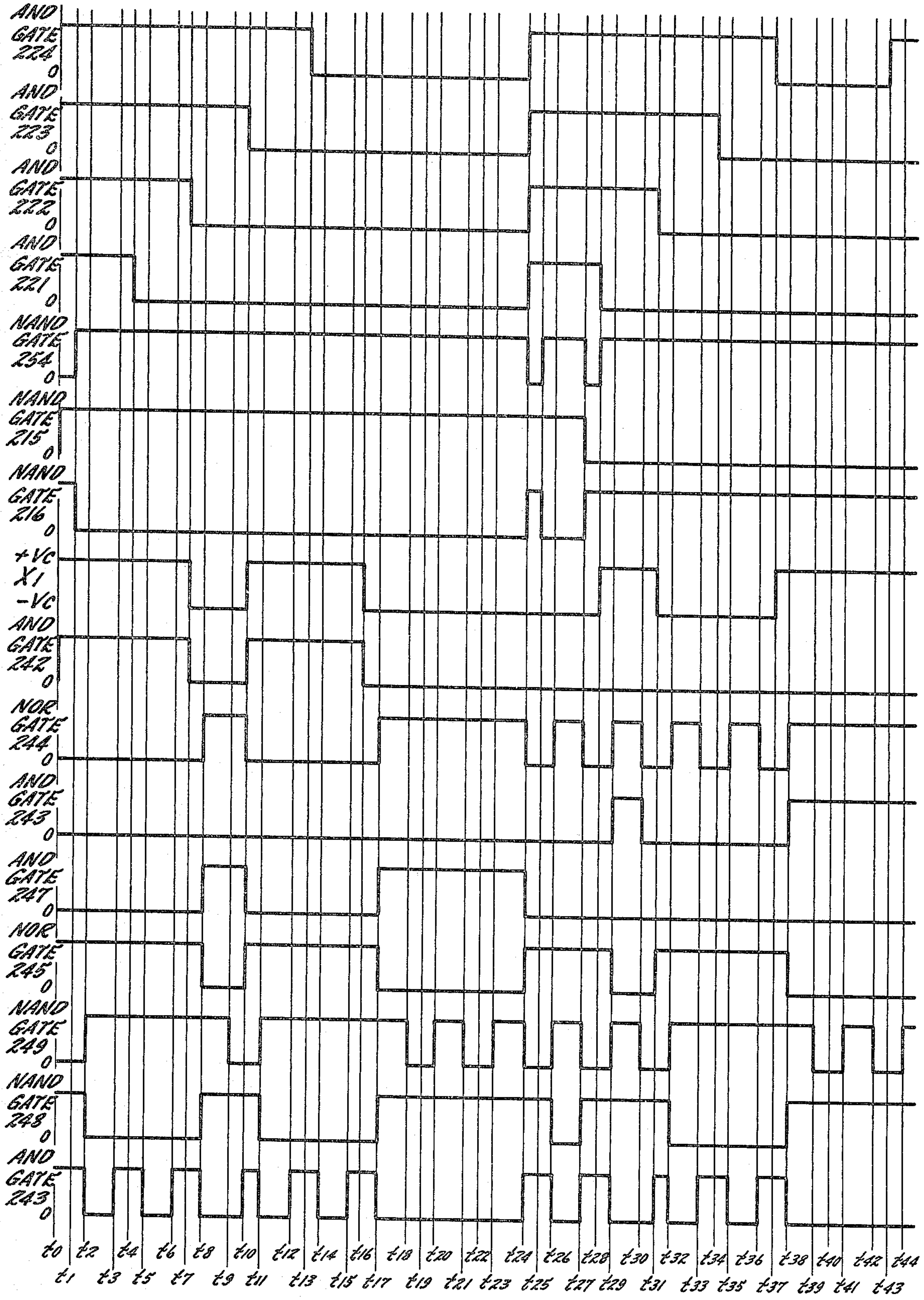
Figure 8C:
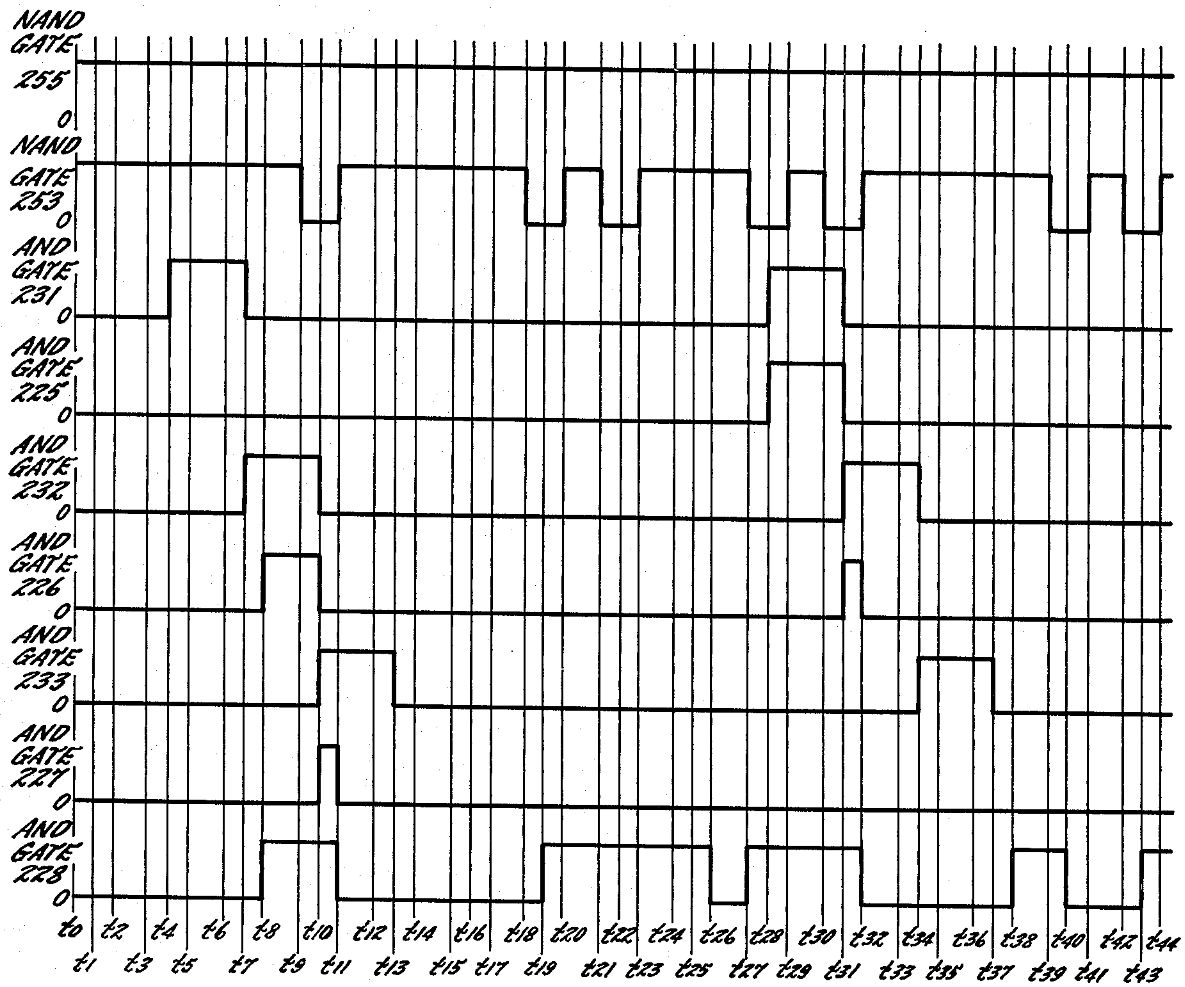

Turning to the logic diagram shown in FIG. 7 and to the timing chart provided by FIGS. 8A–8C, it will become apparent that the control logic 26 is, in this instance, adapted to an absolute value plus sign PCM code format. More specifically, the encoder illustrated by FIGS. 6 and 7 divides each encoding cycle into eight equal length time slots and allots seven of those time slots to the PCM code word, so that each code word has a time slot for a sign bit followed by six additional time slots for weighted bits. The last of eighth time slot of each encoding cycle provides time for the encoder to be cleared in preparation for the next cycle and may, if desired, be employed to carry an additional bit (provided by means not shown) to digitally convey further information. As will be recalled, a voice grade transmission characteristic can be achieved in a carrier telephone system with only seven time slots per PCM code word, if the encoding is carried out in accordance with the aforementioned compression function.

The control logic 26 advances the encoding process a step at a time at a predetermined digital bit rate and cycles the encoder at the frequency or repetition rate of the PAM samples. To achieve those ends, the control logic is supplied (by means not shown) with start pulses S and clock pulses C via leads 200, 201, respectively. The start pulses S, having a repetition rate equal to the repetition rate of the samples are phased so that there is a complete encoding cycle for each sample. The clock pulses C have a higher repetition rate selected to divide each encoding cycle into several equal length time slots. For example, for applications of the encoder involving the aforementioned compression function to non-linearly encode in a twenty-four channel carrier telephone system having an 8 KHz. channel sampling rate, the recommended repetition rates for the start and clock pulses are 0.193 MHz. and 1.544 MHz., respectively. Moreover because the clock pulses C are additionally employed in the illustrated embodiment to momentarily disable or inhibit the control logic 26 for the initial portion of each time slot so that there is a short settling time for any switching transients that may be present, we recommend that the clock pulses have a duty factor of about 50 percent or even slightly higher. The start pulses S, on the other hand, preferably have a duration substantially equal to the period of the clock pulses C. As will be seen, the start pulses are inverted by a NAND gate 209 before being applied to the balance of the control logic.

The control logic 26 includes a plurality of bistable means 202–208; the first to control the offset generator 25 and the others to step the attenuator 24 (FIG. 6). The bistable means 202 may be a relatively simple flip-flop circuit and is, therefore, shown as comprising a pair of NAND gates 215 and 216, which are cross-coupled so that each of them has one input connected to the output of the other. The output of the NAND gate 216, which is sometimes called the "set output") of the flip-flop circuit 202, is coupled by the current limiting resistor 113 to the base of the transistor 112 in the offset generator 25 (FIG. 6). The bistable means 203–208, on the other hand are included in a register 220, which is a serial in and serial out memory element. For that reason, we suggest that the bistable means 203–208 be respective J-K type flip-flop circuits so as to be free of any ambiguous or undefined response characteristics, even should both inputs to any one of them simultaneously be at a high (1) logic level.

The attenuator stages 41–46 are switched into and out of the attenuator in response to control signals supplied by the flip-flop circuits 203–208, respectively. To that end, the emitters of the field effect transistors 71–80 are coupled to the outputs of respective driver circuits 81–90 which, in turn, have their inputs coupled to receive the control signals. As described more fully hereinafter, the driver circuits 81–90 are level translators which are included to translate the control signals from the high (1) and low (0) logic levels at which they are supplied by the flip-flop circuits 203—208 to levels of about −15 volts and 0 volts to cause the field effect transistors 71–80 to switch into and out of conduction in response to low (0) and high (1) level control signals, respectively.

More particularly, as will be recalled, in the illustrated attenuator 23, the first four stages 41–44 are L-type sections and the last two stages 45 and 46 are shunt type sections. A pair of complementary control signals are required for each L-type section and, therefore, the flip-flop circuits 203–206 are shown as having their set outputs Q1–Q4 respectively coupled to the driver circuits Q1–Q4 for the parallel connected field effect transistors 70–74 and their reset outputs $\overline{Q1}$–$\overline{Q4}$ respectively coupled to the driver circuits 85–88 for the series connected field effect transistors 75–78. In contrast, only one control signal is required for each shunt type section and, consequently, the flip-flop circuits 207 and 208 are shown as having their reset outputs $\overline{Q5}$ and $\overline{Q6}$ respectively coupled to the driver circuits 89 and 90 for the series connected field effect transistors 79 and 80.

Concentrating for the moment on the register 220, it will become apparent that some of the flip-flop circuits 203–208 may be set and others of them may be reset as an encoding cycle nears completion. The flip-flop circuits must, however, all be reset as each new encoding cycle begins. To that end, the reset inputs R of the flip-flop circuits 203–208 are tied together and connected to the output of the NAND gate 209. As will be appreciated, the output of the NAND gate 209 falls from a high (1) logic level to a low (0) logic level in response to the leading edge of each start pulse S. Hence, at the end of each encoding cycle, a negative-going signal is applied to the reset inputs R of the flip-flop circuits 203–208, thereby causing any of them that is in a set state to switch to a reset state. Then, as the output of the NAND gate 209 returns to a high (1) logic level in response to the trailing edge of the start pulse S, the next or new encoding cycle begins. The encoding process, in turn, advances a step at a time at the predetermined digital bit rate in response to the clock pulses C.

In an absolute value plus sign PCM format, the first time slot of each code word is reserved for a sign bit. Thereafter, the flip-flop circuits 203–208 are sequentially set as the encoding process advances to the successive weighted time slots of the code word and selectively reset to step or incrementally adjust the attenuation level of the attenuator 23 for progressively factoring the sum voltage. It will, of course, be understood that the attenuator stages 41–46 are switched into and out of the attenuator 23 as the flip-flop circuits 203–208, respectively, are set and reset. To permit the flip-flop circuits to be sequentially set and selectively reset, the register 220 further includes a string of AND gates 221–224, a staggered array of AND gates 225–228, and a number of inter-stage AND gates 231–233. In other words, the register 220 is what has been previously referred to as a shift register with a non-propagating memory.

It may be helpful to briefly review the operation of a typical J–K type flip-flop circuit before considering the register 220 in greater depth. The J–K flip-flop circuit employed in the illustrated embodiment are clock controlled and are triggered or clocked in response to the negative going transitions applied to their clock inputs. If such a circuit is in its reset state and a high (1) logic level signal is then applied to its J input, the circuit switches to its set state the next time it is clocked, regardless of the logic level of the signal applied to its K input. Contrariwise, if the circuit is in its set state and a high (1) logic level signal is then applied to its K input, the circuit switches to its reset state the next time it is clocked. Finally, if the circuit is in either its set or reset state and the logic levels of the signals applied to its J and K inputs are both low (0), the circuit does not change states when it is clocked.

Returning with that in mind to the register 220, the AND gates 221–224 initiate the sequential switching of the flip-flop circuits 203–208 from their reset to their set states and also prevent any one of the flip-flop circuits 203–208 from being switched to its set state more than once per encoding cycle. More particularly, the AND gates 221–224 are connected in a string to enable the flip-flop circuits 203–208 to be switched to their set states only as the encoder advances to the successive weighted time slots of the code word. To that end, the first AND gate 224 of the string has one input coupled to the reset output $\overline{Q5}$ of the flip-flop circuit 207 and another input coupled to the reset output $\overline{Q4}$ of the flip-flop circuit 206. The other AND gates 221–223 of the string have first inputs respectively coupled to the reset inputs $\overline{Q1}$–$\overline{Q3}$ of the flip-flop circuits 203–205 and second inputs respectively coupled to the outputs of the AND gates 222–224. The output of the final AND gate 221 of the string is coupled to the J input of the first flip-flop circuit 203. Accordingly, it will be understood that the AND gates are all enabled at the outset of each encoding cycle to provide a high (1) logic level signal for the J input of the flip-flop circuit 203 and then progressively disabled for the balance of the encoding cycle as the flip-flop circuits 203–206 are sequentially switched to their set states.

The flip-flop circuit 203 switches to its set state as the encoding process advances to the first weighted time slot of the code word. The inter-stage AND gates 231–233 then cause the high (1) logic level to sequentially propagate to the J inputs of the flip-flop circuits 204–208 at the digital bit rate so that the flip-flop circuits 204–208 are sequentially switched to their set states after the flip-flop circuit 203 has been initially switched to its set state. To accomplish that, the inter-stage AND gates 231–234 have first inputs respectively coupled to the outputs Q1–Q3 of the flip-flop circuits 203–205, second inputs respectively coupled to the outputs of the AND gates 222–224, and outputs respectively coupled to the J inputs of the flip-flop circuits 204–206. As a result, the AND gates 231–232 are sequentially enabled for successive ones of the weighted time slots of the code word to cause a high (1) logic level signal to propagate to the J inputs of the flip-flop circuits 204–208 in order and at the digital bit rate.

The AND gates 225–228 are provided to permit the flip-flop circuits 203–207 to be selectively reset. Specifically, the flip-flop circuits 203–207 are sequentially conditioned to be reset as the encoding process advances to the time slots immediately following the respective time slots during which they are switched to their set states. The last flip-flop circuit 208 is not switched to its set state until the encoder advances to the last time slot of the code word and it is, therefore, reset simply in response to the start pulse S which marks the end of the encoding cycle. Indeed, the K input of the flip-flop circuit 208 may suitably be referenced to ground. The other flip-flop circuits 203–207 are, however, selectively reset so that the attenuator stages 41–45 controlled thereby may be retained in or removed from the attenuator 23. Thus, as illustrated, the AND gates 225–228 have first inputs which are tied together and coupled to the output of an exclusive OR gate 241, seconds inputs which are respectively coupled to the outputs of the AND gates 231–233 and the reset output of the flip-flop circuit 207, and outputs which are respectively coupled to K inputs of the flip-flop circuits 203–206.

The exclusive OR gate 241 isolates the control logic 26 from switching transients that may be present at the output of the comparator 24 (FIG. 6) and converts the output signal supplied by the comparator 24 to discrete digital signals for further processing by the control logic 26. To accomplish those objectives the OR gate 241 has a first input coupled to the output of the comparator 24, a second input coupled to the output of the NAND gate 215 (i.e. the "reset output" of the flip-flop circuit 202), and a control input coupled to the clock line 201. The output of the OR gate 241 is coupled to the first or common inputs of the AND gates 225–228 and also to respective inputs of two additional NAND gates 253 and 254, which are discussed more fully hereinbelow.

The exclusive OR gate 241 is inhibited from responding to the polarity of the comparator output signal in the presence of a clock pulse C. That is, when the clock pulse line 201 is at a high (1) logic level, the OR gate 241 is latched so that its output cannot change from one logic level to the other, even should the polarity of the comparator output signal change. The latch is, however, released whenever the clock pulse line 201 is at a low (0) logic level, and the OR gate then has an output response dependent on the state of the flip-flop circuit 202, together with the polarity of the comparator output signal. Specifically, if the flip-flop circuit 202 is in its reset state, the OR gate 241 inverts the comparator output signal to provide a high (1) logic level signal if the comparator output signal has a negative polarity and a low (0) logic level signal if the comparator output signal has a positive polarity. On the other hand, if the flip-flop circuit 202 is in its set state, there is no inversion and the OR gate 241, therefore, provides a high (1) logic level signal if the comparator output signal has a positive polarity and a low (0) logic level signal if the comparator output signal has a negative polarity. As a result, while the bits for the weighted time slots of a PCM code word are being generated, the OR gate 241 provides a digital output signal having a logic level dependent on the magnitude of the sum voltage, as divided or attenuated by the attenuator 23, relative to the magnitude of a "decision point voltage."

As a matter of definition, the so-called "decision point voltage" has a magnitude equal to the magnitude of the attenuator reference voltage as summed with any offset voltage provided for the comparator 24. For example, in the illustrated embodiment, where the comparator has an offset voltage which reverses polarity with the attenuator reference voltage and which has a magnitude of ½ bit volts, the magnitude of the attenuator reference voltage exceeds the magnitude of the "decision point voltage" by ½ bit volts.

The functions of the individual components of the exclusive OR gate 241 can best be understood in the context of the operations they perform during typical encoding cycles such as described below. At this point, however, it should be noted that, as illustrated, the OR gate 241 comprises one pair of AND gates 242 and 243, which have their outputs coupled to respective inputs of a NOR gate 244. The output of the NOR gate 244 is coupled to the first inputs of another pair of AND gates 246 and 247 which, in turn, have their outputs coupled to respective inputs of a further NOR gate 245. Finally, at the output of the OR gate 241 there is a bistable flip-flop circuit 250 formed by a pair of NAND gates 248 and 249 which are cross-coupled so that each of them has one input coupled to the output of the other. The output of the NOR gate 245 is coupled to the other input of the NAND gate 248 and also to a first input of the AND gate 243. The second input of the AND gate 243 is tied to the other input of the NAND gate 249, and they are coupled to the clock line 201 to serve as the "control input" for the OR gate 241. Similarly, the first input of the AND gate 242 is tied to the other or second input of the AND gate 246, and they are coupled to the output of the comparator 24 to serve as the "first input" for the OR gate 241. And, the second input of the AND gate 242 is tied to the second input of the AND gate 247, and they are coupled to the reset output of the flip-flop circuit 202 to serve as the "second input" for the OR gate 241.

As will be seen, exclusive OR gate 241 is latched, and NAND gate 253 responds to the output signal of the OR gate to insert bits into the time slots of the PCM code word. To that end, the NAND gate 253 has respective inputs coupled to the clock pulse line 201 and to the output of the OR gate 241. In the illustrated embodiment, the NAND gate 253 also has another input coupled to the output of a NAND gate 255, which is provided to suppress the all zeros (0000000) PCM code word. To accomplish that, the NAND gate 255 has its inputs respectively coupled to the set output of the flip-flop circuit 202 (i.e., the output of the NAND gate 216), the output of the AND gate 221, and the output of the NAND gate 253. Hence, it will be appreciated that one or more of the inputs of the NAND gate 255 is at a low (0) logic level to thereby enable the NAND gate 255, except when the flip-flops 203–207 are all in their reset states, concurrently with the flip-flop circuit 202 being in its set state and with the output of the NAND gate 253. In other words, the NAND gate 255 is disabled only when low (0) level bits have been inserted in all but the last of the time slots of a code word. When that occurs, the NAND gate 255 is disabled during the last time slot of the code word to provide a low (0) level input signal for the NAND gate 253 which overrides its normal operation to force it to insert a high (1) level bit into the last time slot of the code word, regardless of the logic level of the signal supplied by the OR gate 241.

The NAND gate 254, on the other hand, is provided to enable the polarity of the output voltage of the offset generator 25 to be adjusted on a sample-by-sample basis and to prevent any change in the polarity of that voltage while the bits for the weighted time slots of the code words are being generated. For that reason, the NAND gate 254 has its inputs respectively coupled to the output of the AND gate 221, the output of the exclusive OR gate 241, and the output of an AND gate 252. The output of the NAND gate 254 is coupled to the free or other input of the NAND gate 216, and the free input of the NAND gate 215 is coupled to the complement start pulse line from Inverter 209.

Finally, it is desirable to delay changing the state of the exclusive OR latch in response to changes in the comparator output $X_1$ until switching transients generated by insertion or removal of the attenuator sections have settled. To provide for this delay, a single-shot multivibrator 251 is provided, which generates pulses MV triggered by the leading edge of each clock pulse $c$, with MV pulse duration being less than the duration of the high half of the clock cycle. The flip-flops 203–208 are clocked in response to the trailing edge of the MV pulses, while the exclusive OR latch is gated by the trailing edge of the clock pulses $c$. Thus the time delay between the trailing edge of an MV pulse and the leading edge of the next succeeding clock pulse $c$ allows for settling of transients generated by insertion or removal of an attenuator stage. As illustrated, the multivibrator pulses MV are directly applied to the clock inputs of the flip-flop circuits 207 and 208. The AND gate 252 is, however, included between the multivibrator 251 and the clock inputs of the flip-flop circuits 203–206 to provide buffering for multivibrator 251, and, even more importantly, to protect the flip-flop circuits 203,204,205, and 206 from being spuriously reset when flip-flop 208 is set by the sixth MV pulse.

THE OPERATION OF THE ENCODER

To bring the foregoing into sharper focus, a brief review of a couple of encoding cycles may be helpful. Starting with the application of a start pulse S to the start pulse line 200 at time $t_0$, it will be seen that the output of the NAND gate 209 then drops to a low (0) level to cause any of the flip-flops 203–208 which are in their set states to switch to their reset states. The result is that at time $t_0$ all of the stages 41–46 are removed from the attenuator 23 (FIG. 6) to reduce its attenuation level to substantially zero, the AND gates 221–224 are enabled to apply a high (1) logic level signal to the J input of the flip-flop circuit 203, and the NAND gate 215 is enabled to apply a high (1) level signal for one of the inputs of the NAND gate 216. When the output of the multivibrator 251 drops at time $t_1$, the AND gate 252 is disabled to, in turn, enable the NAND gate 254. Consequently, at time $t_1$ , both inputs of the NAND gate 216 are at high (1) logic levels, whereby the flip-flop circuit 202 is reset so that the sign output is low, and transistor 112 of the offset generator 25 (FIG. 6) is in its non-conductive state to thereby cause the attenuator reference voltage and the comparator offset voltage to have negative polarities. This encoder is, therefore, conditioned for determining the polarity of the applied sample. The determination is not, however, made immediately. Instead, there is a short delay to provide settling time for any switching transients that may be present before the OR gate 241 is unlatched to respond to the polarity of the comparator output signal $X_1$. The sign decision is made on the basis of the state of $X_1$ when the clock input first goes "high" (1 level) after the start line 200 has gone "low." This occurs at time $t_3$, which marks the beginning of the encoding sequence.

For this example, it has been assumed that the applied sample has a positive polarity (or, at least, that it is positive relative to the comparator offset voltage). That is, the comparator output signal $X_1$ is shown as having a positive polarity at time $t_3$ when the clock line 201 returns to a high (1) logic level to re-latch the OR gate 241. As a result, between time $t_2$ and time $t_3$, the AND gate 242 is enabled to disable the NOR gate 245. Accordingly, just prior to time $t_3$ (i.e., while the clock line 201 is still at a low (0) level to enable the NAND gate 249), both inputs to the NAND gate 248 are at high (1) logic levels and it is, therefore, disabled. Also, there is a high (1) logic level signal on the non-clock input of the AND gate 243. Hence, when the clock pulse line 201 goes to a high (1) logic level at time $t_3$, the OR gate 241 is latched with its output (i.e., the output of the NAND gate 248) at a low (0) logic level. Even should the polarity of the comparator output signal $X_1$ tend to thereafter reverse because of switching transients or the like, the OR gate 241 will remain latched until the clock line again drops to a low (0) level. Specifically, the AND gate 243 is enabled to time $t_3$ to ensure that the NOr gate 245 remained enabled, even should the AND gate 242 be disabled. Thus, the NAND gate 248 remains disabled because both of its inputs are held at a high (1) logic level.

As will be understood, the NAND gates 253 and 254 are both conditioned at time $t_3$, when the start lead goes "low," causing the output of NAND gate 209 to go "high," to respond to the output signal from the OR gate 241 because all of the other inputs to those gates are then at high (1) logic levels. The NAND gate 253 remains so conditioned until the clock line 201 again drops to a low (0) level at time $t_5$. Hence, in this example, the NAND gate 253 is enabled between times $t_3$ and $t_5$ to insert a high (1) level bit into the first or sign bit of the code word to digitally indicate that the sample has a positive polarity. The NAND gate 254, on the other hand, is conditioned to respond to the output of the OR gate 241 for a somewhat shorter period, which expires at time $t_4$ when the output of the multivibrator 251 drops to a low (0) level to disable the AND gate 252. Again, in this example, the low (0) level of the output from the OR gate 241 causes the NAND gate 254 to be enabled at time $t_3$. Both inputs to the NAND gate 216 are, therefore, held at high (1) logic levels so that it is disabled to maintain the NAND gate 215 enabled. In other words, in this instance, the flip-flop circuit 202 is held in its reset state to ensure that the transistor 112 (FIG. 6) is held in its non-conductive state. Thus, the attenuator reference voltage and the comparator offset voltage supplied by the offset generator 25 have negative polarities to properly reflect the polarity of the applied sample.

When the output of the multivibrator 251 drops to a low (0) level at time $t_4$ to disable the AND gate 252, the flip-flop circuits 203–208 are clocked. The flip-flop circuit 203 is the only one that has a high (1) level signal on its J input at that time. Accordingly, at time $t_4$, the flip-flop circuit 203 is switched to its reset state, while the other flip-flop circuits 204–208 remain in their reset states. Of course, when the flip-flop circuit 203 is in its set state, its set output Q1 is at a high (1) logic level and its reset output $\overline{Q1}$ is at a low (0) logic level, so that the field effect transistors 71 and 75 are respectively driven out of and into conduction to insert the first stage 41 into the attenuator 23 (FIG. 6), whereby the attenuation level of the attenuator is increased at time $t_4$ from substantially zero to a higher level substantially equal to the attenuation factor associated with the first attenuator stage 41. Also, as the flip-flop circuit is switched at time $t_4$ to its set state, the AND gate 221 is disabled to cooperate with the AND gate 252 in preventing the flip-flop circuit 203 from again being switched to its set state during the encoding cycle, and the AND gate 231 is enabled to cause the high (1) level input signal to propogate to the J input of the flip-flop circuit 204 and to condition the selective reset gate 225 for the first flip-flop circuit 253 to be enabled.

After the first stage 41 is inserted into the attenuator 23, the sum voltage is attenuated or divided by the attenuation factor associated with that stage, and the polarity of the output signal from the comparator 24 then depends on the magnitude of the attenuated reference voltage related to the magnitude of the so-called decision point voltage. In the illustrated embodiment, if the attenuation factor may be extracted from (i.e., divided out of) the sum voltage without causing the magnitude of the sum voltage to drop below the magnitude of the decision point voltage, the comparator output signal has a positive polarity. Contrariwise, if the factor cannot be extracted from the sum voltage without causing its magnitude to drop below that of the decision point voltage, the comparator output signal has a negative polarity.

Following the insertion of the first stage 41 into the attenuator 23 at time $t_4$ there is a short delay before the clock line 201 drops to a low (0) level at time $t_4$ to unlatch the OR gate 241 to enable it to respond to the polarity of the comparator output signal. Again, the delay provides time for any switching transients that may be present to be at least substantially reduced. Then, when the clock line 201 is returned to a high (1) logic level at time $t_6$, the OR gate 241 is re-latched and the NAND gate 253 is conditioned to insert a bit into the second time slot of the code word (which is, of course, the first "amplitude" time slot). As shown in this example, it has been assumed that the factor associated with the first stage 41 of the attenuator can be extracted from the sum voltage without decreasing the magnitude of the divided sum voltage below the magnitude of the decision point voltage. Thus, the comparator output signal $X_1$ is illustrated as having a positive polarity between times $t_4$ and $t_6$ which causes the OR gate 241 to be latched at time $t_6$ with its output at a low (0) logic level to, in turn, cause the NAND gate 253 to insert a high (1) level bit into the first amplitude time slot of the code word, much in the same manner as previously explained in connection with the sign bit.

It should, however, be noted that the NAND gate 254 is inhibited from responding to the output of the OR gate 241 from the time $t_4$ onward because one or more of its other inputs is then at a low (0) logic level. Specifically, the NAND gate 254 is enabled, regardless of the logic level at the output of the OR gate 241 from the time $t_4$ until the next start pulse S appears on the start pulse line 200 at time $t_{24}$. Hence, the flip-flop circuit 202 is latched so that the polarities of the attenuator reference voltage and the comparator offset voltage cannot be changed while the bits for the weighted pulse positions of the code word are being generated.

As previously mentioned, the high (1) level signal is propogated to the J input of the flip-flop circuit 204 and the reset gate 225 is conditioned to respond to the output of the OR gate 241 at time $t_4$. Thus, when the output of the multivibrator 251 thereafter drops to a low (0) logic level at time $t_7$ to clock the flip-flop circuits 203–208, the flip-flop circuit 204 is switched to its set state to insert the second stage 42 into the attenuator 23 and the flip-flop circuit 203 either remains in its set state or is switched to its reset state. More particularly, in this example, the output of the OR gate 241 is at a low (0) level at time $t_7$ and the reset gate 225 is, therefore, then disabled so that the flip-flop circuit 203 remains in its set state. Hence, attenuation factors of the first and second stages 41 and 42 of the attenuator 23 multiplicatively combine at $t_7$ to define a new trial divisor for the sum voltage. Of course, at time $t_7$ the AND gate 222 is disabled to, in turn, disable the AND gate 231 so that the AND gate 225 is inhibited to thereafter prevent the flip-flop circuit from being spuriously switched to its reset state. It will, therefore, be understood that the flip-flop circuit 203 can be selectively reset only as the encoding process advances to the time slot immediately following the time slot for which the flip-flop circuit 203 is switched to its set state. In other words, the selective reset action for the flip-flop circuits 203–207 is delayed by precisely one time slot from their sequential set action.

The new trial divisor provided by the attenuator 23 for the second weighted time slot of the code word comprises the multiplicative combination of the attenuator factor associated with the first stage 41 (as a previously identified factor tending to cause the divided sum voltage to converge on the decision point voltage) and the attenuation factor associated with the second stage 42. Hence, it will be appreciated that the factors of the sum voltage are effectively extracted from the sum voltage as they are identified. There is again a brief delay after the new trial divisor is formed at time $t_7$ before the OR gate 241 is again unlatched as the clock line 201 falls to a low (0) logic level at time $t_8$ to permit the OR gate 241 to respond to the polarity of the comparator output signal.

In this example, it has been assumed that the trial divisor provided for second weighted time slot of the code word is so large that it causes the magnitude of the attenuated or divided sum voltage to drop below the magnitude of the decision point voltage. To that end, the comparator output signal $X_1$ is shown as having a negative polarity from $t_7$ until after the clock line 201 returns to a high (1) logic level at time $t_9$. Accordingly, at time $t_9$ the OR gate 241 is latched with its output at a high (1) logic level, which causes the NAND gate 253 to insert a low (0) level bit into the second weighted time slot of the code word. More particularly, concentrating on the latching of the OR gate 241, it will be seen that the AND gate 242 is disabled from time $t_8$ to time $t_9$ because the comparator output signal $X_1$ has a negative polarity. During that same period of time, the AND gate 243 is also disabled because the clock pulse line 201 is at a low (0) logic level. Thus, the NOR gate 244 is enabled. As previously mentioned, the flip-flop circuit 202 is held in its reset state between times $t_4$ and $t_{24}$. Hence, at time $t_7$, the AND gate 247 is enabled and the NOR gate 245 is, therefore disabled. Accordingly a low (0) level input signal is applied by the NOR gate 245 to an input of the NAND gate 248 and also to an input of the AND gate 243. Consequently, the NAND gate 248 is enabled to supply a high (1) level output signal and the AND gate is disabled, even after the clock pulse line 201 returns to a high (1) level at time $t_9$. Now, the polarity of the comparator output signal $X_1$ might reverse after time $t_9$. However, so long as the clock line 201 is at a high (1) logic level, the NAND gate 249 is disabled to supply a low (0) level input signal for the NAND gate 248, thereby maintaining the OR gate 241 latched with its output at a high (1) logic level.

Returning to the flip-flop circuit 204, it will be understood that when it switches to its set state at time $t_7$, the AND gate 232 is enabled to cause the high level (1) input signal to propogate to the J input of the next flip-flop circuit 205 and to condition the reset gate 226 to respond to the output of the OR gate 241. Accordingly, when the output of the multivibrator 251 drops at time $t_{10}$ to clock the flip-flop circuits 203–208, the AND gates 226 and 232 are both enabled and the flip-flop circuit 205 is, therefore, switched to its set state, while the flip-flop circuit 204 is switched back to its reset state. Thus, the second stage 42 is selectively removed from the attenuator 23 as the third stage is inserted so that another trial divisor is formed at time $t_7$ for the third weighted time slot of the code word. In this instance, the newly formed trial divisor comprises the multiplicative combination of the attenuation factors associated with the first and third stages 41 and 43, respectively, of the attenuator 23.

The encoding cycle continues in generally the same manner as the fourth flip-flop circuit 206 is switched in order to insert the fourth stage 44 into the attenuator. The fifth MV pulse will set flip-flop 207 and may also clear flip-flop 206, depending upon the output of the exclusive-OR latch 241. However, only one switch, 79, is operated by flip-flop 207, as previously mentioned. This stage introduces the factor $(\mathbf{101})^{2/63}$ into the trial value of K. The sixth clock pulse will latch OR gate 241 in a state that will insert a one or a zero, as appropriate, for the fifth most significant bit. The trailing edge of the fifth MV pulse will reset flip-flop 207 or leave its state unchanged, depending upon the state of $X_1$ at the leading edge of the corresponding clock pulse. The trailing edge of the sixth MV pulse will set flip-flop 208, whose $\overline{Q}$ output will drive switch 80 on through driver 90 (FIG. 6). This introduces factor $(\mathbf{101})^{1/63}$ into the trial value of K. After the transients have settled, the $X_1$ state will be latched in OR gate 241 by the leading edge of the seventh clock pulse at time *t*21. This state will be gated with the clock pulse from t21 to *t*23 in NAND gate 253 to produce the least significant bit output. Because this is the last comparison made, there is no need to reset flip-flop 208, regardless of the result of the last comparison, until the next start pulse appears at the input to gate 209. The critical times are marked on the timing chart of FIGS. 8*a*–8*c*, and thus reference may be had thereto for a future explanation of what takes place while the encoding cycle is completed.

Skipping ahead to time t24, it will be seen that another start pulse S then appears on the start pulse line 200 to reset any of the flip-flop circuits 203-208 that is then in its set state. At time t24 the NAND gate 254 is conditioned to respond to the output signal from the OR gate 241 because its other inputs are all at high (1) logic levels. Accordingly, if the output of the OR gate 241 is then at a high (1) logic level, the NAND gate 254 will be disabled to thereby enable the NAND gate 216. But, when the output of the multivibrator 251 drops to a low (0) level at time $t_{25}$, the NAND gate 254 is enabled. That, together with the high (1) logic level on the complement start line from inverter 209, causes the NAND gate 216 to be disabled, so that flip-flop circuit 202 is in its reset state at time $t_{25}$.

The polarity of the new sample is determined when the start line again drops to a low (0) logic level at time $t_{27}$ to initiate the new encoding cycle. As illustrated, the comparator output signal has a negative polarity from time $t_{26}$ to time $t_{27}$. Consequently, as the clock line 201 returns to a high (1) level at time $t_{27}$, the OR gate 241 is latched with its output at a high (1) logic level. The NAND gate 253 is then disabled to insert a low (0) level sign bit into the first time slot of the code word to digitally indicate that the applied sample has a negative polarity. Also, at time $t_{27}$, the NAND gate 254 is disabled to switch the flip-flop circuit 202 to its set state which, in turn, drives the transistor 112 of the offset generator 25 into conduction. Thus, the polarity of the output voltage from the offset generator is reversed so that the attenuator reference voltage and the comparator offset voltage then have positive polarities.

As will be appreciated, once the appropriate polarities for the attenuator reference voltage and the comparator offset voltage have been established, the encoding cycle progresses as generally outlined above. It should, however, be noted that the OR gate 241 does not invert the comparator output signal while the bits for the weighted time slots of the PCM code word are generated. Specifically, when the flip-flop circuit 202 is in its set state, the AND gates 242 and 247 of the OR gate are disabled. Hence, if the comparator output signal $X_1$ has a positive polarity, the AND gate 246 is enabled to disable the NOR gate 245 which, in turn, cause the OR gate 241 to latch with its output at a high (1) logic level. On the other hand, if the comparator output signal $X_1$ has a negative polarity, the AND gate 246 is disabled to thereby enable the NOR gate 245 so that the OR gate 241 is latched with its output at a low (0) logic level.

The encoding cycle proceeds a step at a time by sequentially testing new factors in the trial value of K. This sequence must advance one step with each clock pulse by sequentially setting the flip-flops 203 through 208. This progression is controlled by driving the J input of each flip-flop from the proceeding output. This causes the 1 level, which is present at the J input of 203 after the logic is cleared, to be propagated to the right one step with each successive MV pulse. This is similar to the action of a shift register. Gates between the successive stages allow the protection zero line (described below) to block the path after the flip-flop is first set.

To elaborate, when the gate 209 resets all the flip-flops, the output of the gate 221 goes to the 1 level, as will be described later. This enables the J input of the flip-flop 203, so that the first MV pulse sets the flip-flop 203. Once the flip-flop 203 is set, the output of the gate 221 is always low (0) whenever the common clock line for 203 through 206 is high. (1) Therefore, the flip-flop 203 cannot subsequently be clocked to a set condition in the encoding cycle. The one (1) level present at the Q output of the flip-flop 203 after it is set is transmitted to the J input of the flip-flop 204 while the second MV pulse is high. As a result, the flip-flop 204 will be set by the trailing edge of the second MV pulse. Once the flip-flop 204 is set, the output of the gate 222 is low whenever the common clock line is high, for the remainder of the encoding cycle. This causes the gate 231 to drive the J input of the flip-flop 204 to the zero level, thereby preventing the flip-flop 204 from being clocked to the set condition.

A similar arrangement controls the propagation of the set condition to flip-flops 205 and 206. The J input of the flip-flop 207 will prevent its resetting by the sixth MV pulse. The trailing edge of the seventh MY pulse could cause flip-flop 207 to toggle momentarily, but by this time the seventh bit output will have been determined and no error will result. Similarly, flip-flop 208 is set by the trailing edge of the sixth MV pulse and the direct connection from the Q output of the flip-flop 207 to its J input.

STATE PROTECTION SUBFUNCTION

As an encoding cycle progresses, it is important to retain factors of K which do not cause the trial value to exceed the "proper" value and to discard those factors which do. The factors corresponding to descending bit weights are tested one at a time and discarded or retained at the trailing edge of the MV pulse. Once a given bit weight has been discarded or retained, its associated flip-flop must remain in the proper state for the duration of the encoding cycle. The flip-flops and the sign latch circuit 202 are protected from spurious setting or resetting by a line of gates 221, 222, 223, and 224. At the beginning of each encoding cycle, all the flip-flops are reset by NAND gate 209 in response to the start signal. As a result, both inputs to AND gate 224 are ones so that its output is one. This output, combined with the one level at the $\overline{Q}$ output of flip-flop 205, enables gate 223. The output of the gate 223 when high (1) combines with the $\overline{Q}$ output of flip-flop 204 to drive the output of gate 222 to the 1 level, enabling the gate 221 in combination with the flip-flop 203 output. This results in a one state at the output of the gate 221, enabling gate 254, so that a negative PAM signal can cause the output of the exclusive OR latch circuit 241 and the MV pulse to reverse the state of the Sign latch.

At the end of the first MV pulse, flip-flop 203 is set, which causes the output of the gate 221 to go to zero. This output blocks the gate 254 so that subsequent inputs will not alter the state of the sign latch. At the trailing edge of the next MV pulse, the flip-flop 203 is reset. This same trailing edge sets the flip-flop 204, however, causing the output of the gate 222 to go to zero. Therefore, at least one if not both inputs to the gate 221 becomes zero, causing its output to be zero. A momentary "glitch" may occur at the output of the gate 221 due to the crossover of states and propagation delays, but it can occur only after the MV pulse goes low, so that the gate 254 does not propagate it further. The trailing edge of the third MV pulse selectively resets flip-flop 204, and necessarily sets flip-flop 205, which produces a 0 input to the gate 223. The resulting zero output progagates to the left, insuring that gates 221 and 222 stay at zero (0) output states (except possibly for a "glitch" at a harmless time).

As the trial bit position advances to the flip-flops 206 and 207, the protection zero state advances to the output of the gate 224 and the $\bar{Q}$ output of the flip-flop 207. This protection zero also prevents individual flip-flops from being reset by a subsequent MV pulse in combination with a comparator output when lower order bit weights are tested. For example, when the flip-flop 204 is set by the MV pulse, the zero at its $\bar{Q}$ output propagates through the gate 222, 231, and 225 to the K input of the flip-flop 203. A zero at its input prevents the flip-flop 203 from being clocked to the reset condition. The zero level at its J input prevents it from being clocked to the set state, so that once the flip-flop 204 has been set, the flip-flop 203 is protected from further state changes during a particular encoding effect transistors to translate the high (1) and low (0) transistor-transistor logic level signals to switching voltages of approximately −15 volts and zero volts, respectively.

Figure 9:
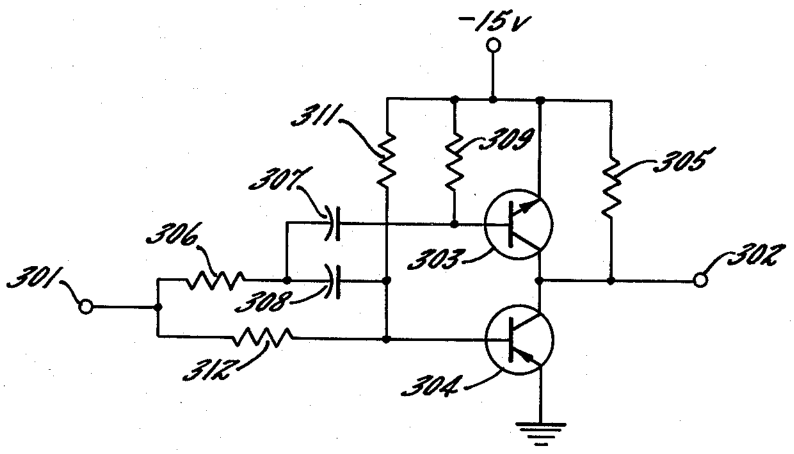
FIG. 9 is a circuit diagram of a suitable driver for the field effect transistor switches of the attenuators utilized in carrying out this invention.

Referring to FIG. 9, each driver circuit has an input terminal 301 coupled to receive a control signal and an output terminal 302 coupled to the gate of an associated field effect transistor (not shown in FIG. 9) to apply as switching voltage thereto in response to the control signal. More particularly, a suitable driver circuit comprises a NPN transistor 303 and a PNP transistor 304, which have their collectors tied together and to the output terminal 302 to the gate of the associated field effect transistor. The emitter of the transistor 303 is coupled to a −15 volt supply source, and a load resistor 305 is coupled across the collector-emitter circuit of the transistor 303. The emitter of the transistor 304, on the other hand, is returned to ground.

The input terminal 301 is coupled to a resistor 306 which, in turn, is coupled to the bases of the transistors 303 and 304 by respective capacitors 307 and 308. The base of the transistor 303 is coupled to the supply source by a resistor 309, which provides a discharge path for the capacitor 307. The base of the transistor 304, on the other hand, is coupled to the juncture of a pair of resistors 311 and 312, which extend from the supply source to the input terminal 301 to form a voltage divider.

The values of the resistors 311 and 312 are selected, together with their voltage dividing ratio, so that the transistor 304 is biased, under steady state conditions, out of conduction if the control signal applied to the driver input 301 is at a high (1) logic level and into saturated conduction if the control signal is at a low (0) logic level. Moreover, the collector-emitter circuit of the transistor 304 is coupled directly across the driver output or, in other words, in parallel with the gate-source circuit of the associated field effect transistor. Consequently, when the applied control signal goes from a low (0) to a high (1) logic level, the transistor 304 switches out of conduction in response to a positive pulse applied to its base via the resistor 305 and the capacitor 307. The output voltage from the driver circuit, therefore, tends to become negative. At the same time, current is routed from the resistor 306, through the capacitor 307 to drive the transistor 303 into conduction. The current drawn by the transistor 303 causes the associated field effect transistor to rapidly switch to its non-conductive state. Then, when the capacitor 307 is fully charged, the transistor 303 switches out of conduction, thereby causing the driver output voltage to stabilize at approximately −15 volts relative to ground. Finally, after the transistor 303 is in its non-conductive state, the capacitor 307 is discharged by current flow through the resistor 309. On the other hand, when the applied control signal goes from a high (1) to a low (0) logic level, a negative pulse is coupled to the base of the transistor 304 via the resistor 306 and the capacitor 308. The transistor 304 thus switches into conduction and becomes saturated very rapidly, thereby causing the driver output voltage to stabilize at substantially zero. Preferably, the capacitor 308 is relatively large to insure that, when the voltage at terminal 301 goes from negative to positive, the voltage at the base of transistor 304 is suddenly made positive to rapidly switch transistor 304 to its non-conductive state.

THE DECODER - IN GENERAL

The decoder performs the complement of the encoding process to serially recover the quantized values of the PAM samples from the train of PCM code words. In a system, such as a carrier telephone system, involving multiplexing and demultiplexing, the quantized values of the samples are, in turn, distributed so that the original analog signals are substantially reconstructed on a channel-by-channel basis.

Briefly reviewing the encoding process, it will be recalled that each sample is summed with a predetermined reference voltage of appropriate polarity to obtain a sum voltage. For bipolar encoding, the first time slot of each code word is reserved for a sign bit which is generated while the polarity of the reference voltage is adjusted, if need be, to reflect the polarity of the reference voltage. Thus, in bipolar encoding, as well as unipolar encoding, the sample is additively combined with the reference voltage while the bits for the weighted time slots of the code word are generated. The encoder comprises a predetermined set of factors which are sequentially tested in a predetermined order during each encoding cycle in timed synchronism with the successive weighted time slots of the PCM code word to provide a final divisor having a value causing the magnitude of the divided sum voltage to approximate the magnitude of the so-called encoder decision point voltage. The final divisor is obtained by selectively retaining those of the factors that may be multiplicatively combined with any previously retained factors to provide a trial divisor which does not cause the magnitude of the sum voltage, as divided by the trial divisor, to drop below the magnitude of the encoder decision point by more than half the least significant bit volts. Any other factors are removed or rejected, with the result that the final divisor has a value which is sufficiently small that the magnitude of the divided sum voltage is within the least significant bit volts of the decision point voltage. The encoder inserts bits into the successive weighted time slots of the code word in response to each of the trial divisors, and the bits have logic levels which digitally discriminate between those of the factors that are and are not retained to multiplicatively contribute to the final divisor. Accordingly, the code word comprises separate bits for the respective factors of the predetermined set of factors, and the logic levels of these bits digitally indicate, in factored form, the value of the final divisor.

Figure 10:
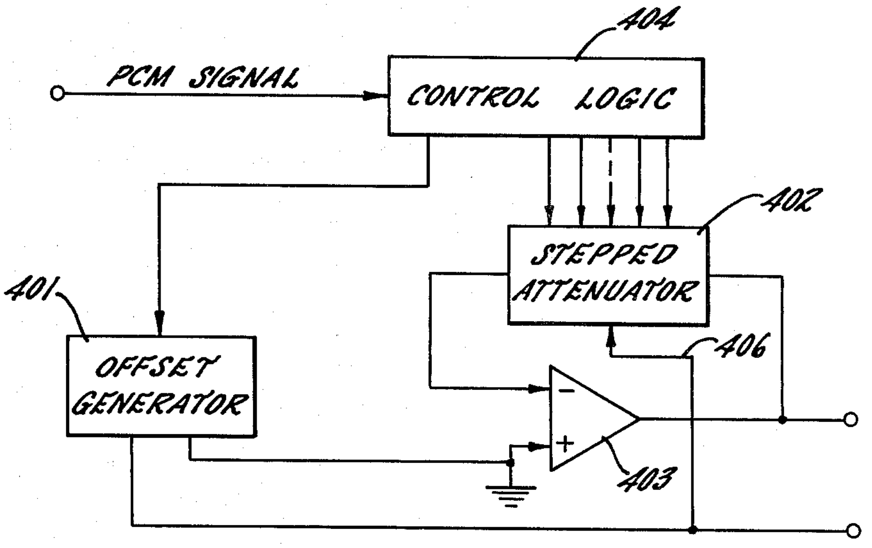
FIG. 10 is a block diagram of a decoder embodying the present invention.

Turning now to the simplified block diagram shown in FIG. 10. it will become apparent that our decoder is matched to the above described encoder. The decoder comprises another set of factors which is substantially identical to the set of factors employed for encoding. Moreover, the decoder is supplied with another reference voltage having a magnitude substantially equal to the magnitude of the reference voltage that is summed in the encoder to obtain the sum voltage. The decoder responds on a code word-by-code word basis to the logic levels of the bits carried by the weighted time slots of the code word to select from the other set of factors those factors that are comprised by the final divisor for the encoded sum voltage. The selected factors are multiplicatively combined to form a multiplier having a value substantially equal to the value of the final divisor, and the other or decoder reference voltage is then multiplied by such multiplier to obtain a quantized value of the encoded sum voltage. Finally, the decoder reference voltage is subtracted from the quantized sum voltage to recover the quantized value of the original sample. Of course, for bipolar decoding, the polarity of the decoder reference voltage is adjusted on a code word-by-code word basis in response to the sign bits so that each code word is decoded with the reference voltage having a polarity appropriate for the original sample. For example, in the illustrated embodiment, a negative decoder reference voltage is required if the original sample has a positive polarity, and a positive decoder reference voltage is required if the original sample has a negative polarity. To carry out the decoding process, the decoder includes another offset generator 401 and another attenuator 402, together with an operational amplifier 403 and a control logic 404. The offset generator 401, which is selected to supply a decoder reference voltage having a magnitude substantially equal to the attenuator reference voltage employed in the encoder (FIGS. 3, 5 and 6), drives the terminal 406 of the stepped attenuator 402. The attenuator 402, which is matched to the encoder attenuator 23, is coupled between the output and inverting input of the operational amplifier 403 to provide negative feedback and to regulate the closed loop gain of the amplifier. In stating that the attenuator 402 is matched to the attenuator 23, we mean that the attenuator 402 has an associated set of attenuation factors which are substantially identical to the factors associated with the attenuator 23 and that any of such factors may be multiplicatively contributed to or withheld from the overall signal attenuation afforded by the attenuator 402.

The control logic 404 has a serial input-parallel output format. The bits of the PCM code words are serially fed into the control logic and the control logic responds to the logic levels thereof on a codeword-by-code-word basis to supply control signals for the decoder. To that end, the control logic 404 has several outputs coupled to the attenuator 402 to supply separate control signals for the attenuation factors associated with the attenuator 402 so that each of the factors may be multiplicatively contributed to or withheld from the attenuation level afforded by the attenuator. Further, for bipolar decoding the control logic 404 has another output coupled to the offset generator 401 to provide a control signal for adjusting the decoder reference voltage.

The operation of the decoder is relatively straightforward, even when bipolar decoding is called for. The bits of the code word to be decoded are first serially fed into the decoder control logic 404. The control logic responds to the logic level of the first or sign bit to provide a control signal for the offset generator 401 to thereby adjust the polarity of the decoder reference voltage so that it reflects the polarity of the original sample. The control logic also responds to the logic levels of the bits carried by the successive weighted time slots of the code word to selectively insert into the attenuator 23 those of its associated attenuation factors that are comprised by the final divisor for the encoded sum voltage. The selected attenuation factors multiplicatively combine with one another and cause the operational amplifier 403 to have a closed loop gain corresponding to the value of the final divisor for the encoded sum voltage. Consequently, the operational amplifier 403 effectively multiplies the decoder reference voltage by a multiplier having a value substantially equal to the value of the so-called final divisor so that its output, with respect to the offset voltage, stabilizes at a voltage which is quantized value of the encoded sum voltage. Finally, the decoder reference voltage is subtracted from the product by referencing the decoder output to the reference voltage, to recover the quantized value of the original sample.

It will, of course, be appreciated that the decoder reference voltage and the attenuation factors associated with the attenuator 402 may be selected to mate the decoder transfer function to a wide variety of encoder transfer functions. For example, for non-linear decoding in accordance with the expansion function previously discussed in connection with equation (16), the decoder reference voltage is selected to have a value equal to $V_1/\mu$ and the attenuation factors associated with the attenuator 402 are selected to equal the successive square roots, including the first of the aforementioned function $$(1+\mu)^{\frac{m+x}{m}}$$

SPECIFIC EMBODIMENT OF THE DECODER

Figure 11A:
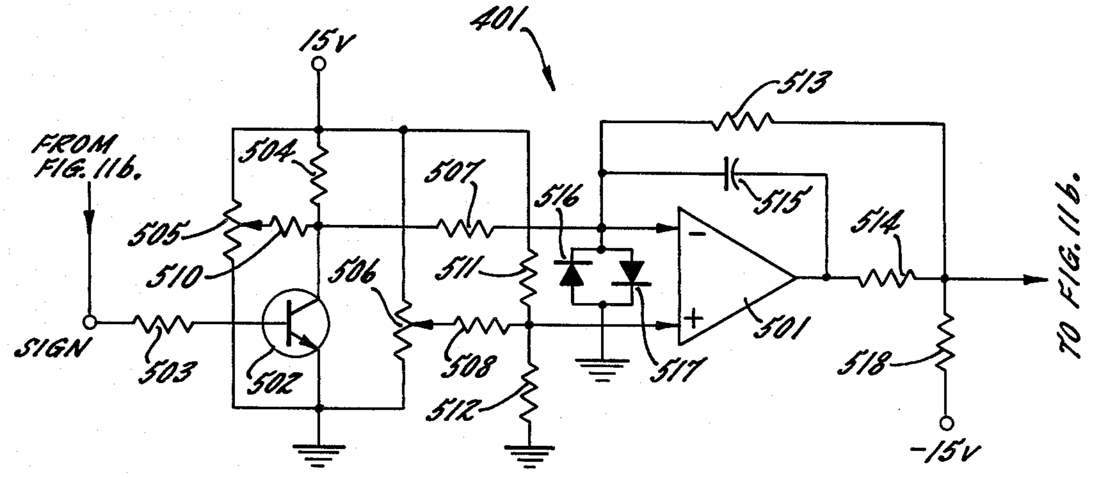
FIGS. 11*a* and 11*b*, when joined as indicated, form a circuit diagram of one implementation of the decoder shown in FIG. 10.
Figure 11B:
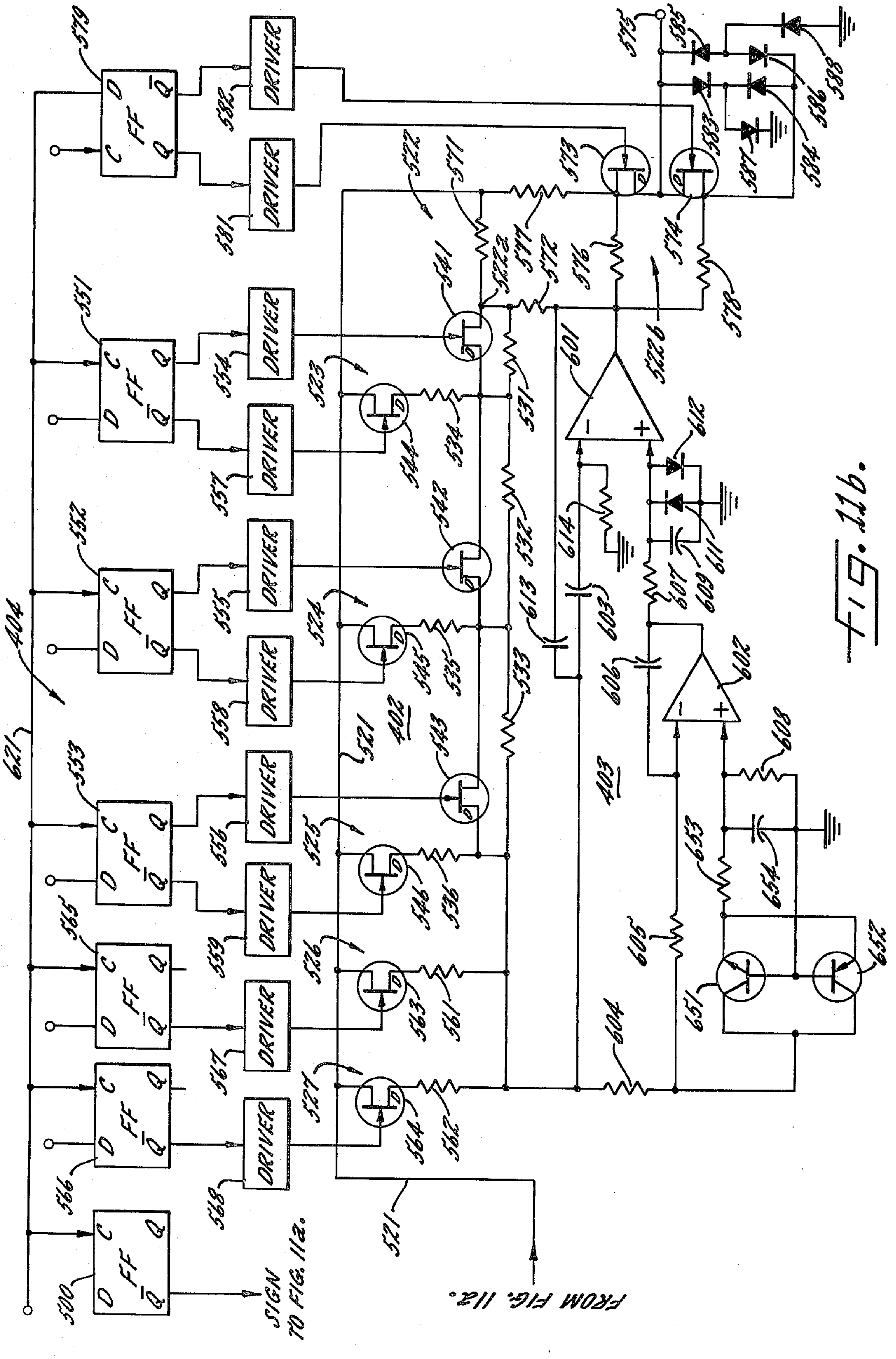

Focusing now on FIGS. 11*a* and 11*b*, there is a specific embodiment of our decoder which is suitable for bipolar decoding, including bipolar decoding in accordance with the specific expansion function of equation (16).

As illustrated in FIG. 11*a*, the offset generator 401 is a reversible polarity, fixed magnitude voltage source which supplies the decoder reference voltage. The offset generator 401 is generally similar to the offset generator 25 of the encoder (FIG. 6). More particularly, the offset generator 401 includes an operational amplifier 501 which is coupled in an inverting mode and biased so that the polarity of its output voltage rapidly reverses as a transistor 502 is switched into and out of conduction. The transistor 502 has its base coupled by a current limiting resistor 503 to receive a control signal from the reset output $\bar{Q}$ of a flip-flop circuit 500 included in the decoder control logic 500. The transistor 502 has its collector connected through a load resistor 504 to a supply source and its emitter returned to ground. Connected between the supply source and ground, in parallel with the collector-emitter circuit of the transistor 502 there are a pair of potentiometers 505 and 506. The slider of the potentiometer 505 is tied to the collector of the transistor 502 through resistor 510 and then coupled by a resistor 507 to the inverting input of the operational amplifier 501. The slider of the potentiometer 506 is coupled by a resistor 508 to the junction between a pair of resistors 511 and 512. The resistors 511 and 512 extend from the supply source to ground to form a voltage divider, and the junction between them is coupled to the non-inverting input of the operational amplifier 501.

The operational amplifier 501 has the usual feedback resistor 513 coupled between its output and inverting input terminals to aid in establishing the desired closed loop gain for the amplifier. Operational amplifier 501 operates into a rapidly varying load having an appreciable capacitive component. Thus, to permit a wide band amplifier to be employed so that the decoder reference voltage remains substantially constant despite the load variations, there is an output resistor 514 coupled between the output terminal of the operational amplifier 501 and the feedback resistor 513 and a feedback capacitor 515 connected from the output of the operational amplifier 501 to its inverting input terminal. The output of the offset generator 401 is taken from the juncture between the output resistor 514 and the feedback resistor 513. Thus, it will be appreciated, that the output resistor 514 buffers the output of the operational amplifier from its load so that the effect of the load variations on the amplifier are materially reduced. The capacitor 515, on the other hand, provides high frequency negative feedback which reduces the settling time required by the operational amplifier 501 when the transistor 502 is switched into or out of conduction. Preferably, the values of the output resistor 514 and the feedback capacitor 515 are selected to have as little effect as possible on the closed loop gain of the operational amplifier 501.

The control signal provided for the offset generator 401 causes the transistor 502 to switch into saturated conduction or out of conduction. Specifically, in the illustrated embodiment, the control signal applied to the base of the transistor 502 has a low (0) logic level if the sign bit of the code word to be decoded has a high (1) logic level and a high (1) level if the sign bit has a low (0) level. Thus the transistor 502 is driven into saturation and out of conduction to, in turn, cause the decoder reference voltage to have a negative and positive polarity for code words associated with positive and negative samples, respectively.

To set the bias and the offset generator 401 so that the magnitude of the decoder reference voltage is substantially the same for both the positive and the negative polarity cases, the values of the fixed resistors 504, 507, 510 and 511–513 are selected so that the decoder reference voltage at least has approximately the desired magnitude for both cases. Then, while the transistor 502 is in saturated conduction, the slider of the potentiometer 506 is adjusted until the positive polarity decoder reference voltage has the desired magnitude relative to ground. Then, while the transistor 502 is held in its non-conductive state, the slider of the potentiometer 505 is adjusted until the negative polarity decoder reference voltage has the desired magnitude relative to ground. As shown in FIG. 11*b*, the decoder reference voltage is applied to the reference bus 521 of the attenuator 402.

To protect the operational amplifier 501 from being overdriven by the transients which may appear when power is first applied thereto, it is advisable that its inverting input be returned to ground by a pair of oppositely poled, parallel diodes 516 and 517. Also, since the load on the operational amplifier 501 may, at times, draw more negative current than the amplifier can provide without the addition of a compensating source (not shown), a load resistor 518 may be advantageously connected between a suitable negative supply source and the output of the offset generator 401. In that event, the additional negative current is drawn externally of the operation of amplifier 501, thereby avoiding the necessity for making allowance in the amplifier 501 for the increased power dissipation that would be involved were the additional current drawn through the amplifier from its power source.

As illustrated in FIG. 11*b*, the decoder attenuator 402 is generally similar to the encoder attenuator 23 (FIG. 6), although there are some important differences, which are deserving of special note. Concentrating for now on the similarities, it will be seen that the decoder attenuator comprises several substantially independent stages 522–527 with preassigned attenuation factors selected so that the decoder attenuator stages 522–527 correspond to respective ones of the encoder attenuator stages 41–46. Specifically, like the encoder attenuator stages 41–46, the decoder attenuator stages 522–527 are assigned respective factors from the predetermined set of factors that is provided for encoding, and such factors are assigned to the stages 522–527 in declining order of significance.

The attenuator stages 523–525, which are respectively associated with the second, third and fourth most significant of the attenuation factors, are L-type sections, having respective series resistors 531–533 and respective shunt resistors 534–536. Furthermore, there is a first group of field effect transistors 541–543 with their source-drain circuits connected in parallel with the series resistors 531–533, respectively, and a second group of field effect transistors 544–546 with their source-drain circuits connected in series with the shunt resistors 534–536, respectively. The field effect transistors 541–543 and 544–546 of the first and second groups are paired so that the attenuator stages 523–525 may be selectively switched into and out of the attenuator 402. To that end, the decoder control logic 404 includes respective flip-flop circuits 551–553 to supply complementary control signals for the field effect transistors of the attenuator stages 523–525. More particularly, the flip-flop circuits 551–553 have their set (Q) outputs coupled to driver circuits 554–556 which, in turn, are coupled to the gates of the parallel connected field effect transistors 541–543, respectively, and their reset ($\overline{Q}$) outputs coupled to driver circuits 554–556 which, in turn, are coupled to the gates of the series connected field effect transistors 544–546, respectively. Accordingly, the attenuator stages 523–525 are inserted into and removed from the decoder attenuator 402 as the flip-flop circuits 551–553 are respectively set and reset. The values of the series and shunt resistors 531-536 are selected as outlined above by equations (19)–(21) so that each of the L-type stages 523–525 has a substantially constant output impedance, regardless of whether the stage happens to be inserted into or removed from the attenuator 402. Consequently, the criteria permitting the attenuation factors assigned to the stages 523–525 to be selectively multiplicatively contributed to or withheld from the overall attenuator level of the attenuator as such stages are switched into and out of the attenuator are met.

The attenuator stages 526 and 527, which are respectively, associated with the fifth and sixth of the attenuation factors (the two least significant factors in this example) are shunt sections comprised of respective shunt resistors 561 and 562, which are returned to the attenuator reference bus 521 through the source-drain circuits of respective series connected field effect transistors 563 and 564. For selectively switching the stages 526 and 527 into and out of the decoder attenuator 402, the decoder control logic 404 includes two further flip-flop circuits, 565–566, which have their reset ($\overline{Q}$) outputs coupled to driver circuits 567 and 568 which, in turn, are coupled to the gates of the field effect transistors 563 and 564, respectively. The values of the resistors 561 and 562 are selected as outlined hereinbefore by equation (22). It will, of course, be recalled that the use of a shunt section rather than a L-type section for a stage of the attenuator provides certain economies at the cost of sacrificing the constant output impedance characteristic of such stage. As a general rule, the variations in the output impedance of the last stage 527 of the attenuator are immaterial. The changes in the output impedance of any preceding stage cannot, however, be so conveniently ignored since such changes cause the attenuation factors of all succeeding stages to depend to some extent on whether the preceeding stage happens to be inserted or removed from the attenuator. Thus, shunt sections should not be used in the preceeding stages of the attenuator, unless the resultant variations in the attenuation factors of the succeeding stages are so slight as to be tolerable. For example, when the attenuator stages 522–527 are assigned attenuation factors in declining order of significance for non-linear decoding in accordance with the expansion function of equation (16), the use of a shunt section for the fifth or next to last stage 526 causes a decoding error of no more than about 1 percent.

As described to this point, the decoder attenuator 402 is substantially identical to the encoder attenuator 23 (FIG. 6). Essentially, complete identity could, at least, theoretically be achieved by including a further L-type section in the attenuator 402 serving as the first stage 522. The gain-bandwidth requirements for the operational amplifier 403 are, however, rather severe when high response speeds are required of the decoder. For example, if the first attenuator stage 522 was another L-type section and the decoder was applied in a 24 channel carrier telephone system for non-linear encoding in accordance with equation (16), the closed loop gain of the operational amplifier 403 would have to be variable over a range of approximately 40db to permit the quantized values of the various signals within the signal range of interest to be recovered. Furthermore, since there is only two microseconds or so during each decoding cycle for the output of the operational amplifier 403 to settle, the amplifier output is required to settle relatively rapidly for all values of closed loop gains. Accordingly, the open loop gain of the operational amplifier 403 should be rolled off with a slope of about 6 db/octave (see, Demrow, R.I., "Settling Time of Operational Amplifiers," Analog Dialogue, Vol. 4, No. 1, Analog Devices, Inc.). As a result, the unity gain bandwidth of the operational amplifier 403 should exceed its minimum closed loop bandwidth by a factor of at least 100. To enable the output of the operational amplifier to settle to within a tolerable 0.03 percent of its final value within the two microsecond period allotted as settling time, a minimum closed loop bandwidth of about 0.65 MHz is called for. Consequently, even if the additional unity gain bandwidth necessary to ensure that the output of the operational amplifier remains substantially constant after the settling time has elapsed is ignored, the minimum unity gain bandwidth for the operational amplifier 203 would have to be at least 65 MHz.

Operational amplifiers having stable unity gain bandwidths as high as 150 MHz are within the present state of the art. But, such amplifiers are expensive and require very precise adjustment, usually by highly skilled personnel. We, therefore, prefer to reduce the unity gain bandwidth required of the operational amplifier 403. To that end, in the illustrated decoder, the necessity for switching the first stage 522 of the attenuator 402 into and out of the negative feedback loop of the amplifier 403 is avoided. That is accomplished by dividing the first stage 522 into two parts **522*a* and 522*b*. The first part 522*a* sets the minimum closed loop gain of the amplifier 403 (i.e., the closed loop gain with the other attenuator stages 523–527 all switched out of the attenuator 402) at a level equal to the attenuation factor assigned to the first stage 522. The second part 522*b* permits the output voltage of the operational amplifier 403 to be selectively divided by an identical factor so that the attenuation factor assigned to the attenuator stage 522 may effectively be multiplicatively contributed to or withheld from the multiplier provided for the decoder reference voltage. The reduction in the unity gain bandwidth required of the operational amplifier 403 is appreciable, especially when the first part 522*a* of the stage 522 is associated with the most significant of the attenuation factors. For example, when non-linear decoding in accordance with the expansion function of equation (16), the unity gain bandwidth required can be reduced by a factor of about 10, so that the operational amplifier 403 need then have a unity gain bandwidth of approximately 6.5 MHz. Resistors 571 and 572 comprise the first part 522a of the first attenuation stage 522 and are selected so that their attenuation ratio (L-Section) is approximately 10.425, which is the weight of the most significant bit. This section is permanently wired and forces the closed loop non-inverting gain of the composite amplifier 403 to have a minimum value of about 10 with respect to the offset bus. Thus the composite amplifier 403 multiplies the decoder reference voltage by at least this factor, regardless of whether the other attenuator stages 523–527 are switched into or out of the attenuator 402**.

The other or second part **522*b* of the attenuator stage 522 includes a pair of field transistors 573 and 574 to provide parallel paths from the output of the operational amplifier 403 to the decoder output terminal 575. There are a pair of resistors 576 and 577 forming a voltage divider connected between the output of the amplifier 403 and the attenuator reference bus 521. Specifically, the values of the resistors 576 and 577 are selected so that the voltage dividing ratio of the divider thus formed equals the attenuation factor associated with the attenuator stage 522. The juncture between the voltage dividing resistors 576 and 577 is connected to the output 575 by the source-drain circuit of the field effect transistor 573. The output of the operational amplifier 403 is also coupled to an output resistor 578, which is coupled by the source-drain circuit of the field effect transistor 574 to the decoder output terminal 575**.

To permit the attenuation factor assigned to the attenuator stage 522 to be selectively multiplicatively contributed to or withheld from the multiplier provided for the decoder reference voltage, the control logic 404 includes flip-flop circuit 579 to supply complementary control signals for the field effect transistors 573 and 574. Specifically, the flip-flop circuit has its set (Q) and reset ($\overline{Q}$) outputs coupled to respective driver circuits 581 and 582 which, in turn, are coupled to the gates of the field effect transistors 573 and 574, respectively. Hence, when the flip-flop circuit 579 is in its reset state, the output of the operational amplifier 403 is routed to the decoder output terminal 575 through the voltage divider 576, 577 and the source-drain circuit of the field effect transistor 573 to the decoder output terminal 575. The attenuation factor associated with the attenuator stage 522 is, therefore, divided out of the output voltage supplied by the operational amplifier so that such factor is effectively withheld from the multiplier for the decoder reference voltage. Contrariwise, when the flip-flop circuit 579 is in its set state, the output of the amplifier 403 is routed to the decoder output terminal 575 through the output resistor 578 and the source-drain circuit of the field effect transistor 574. Consequently, the attenuation factor assigned to the attenuator stage 522 is then effectively multiplicatively contributed to the multiplier for the decoder reference voltage.

Since the decoder normally drives a relatively low impedance load, it is generally desirable to include provision for limiting the swings of the decoder output voltage. Toward that end, there are two oppositely poled pairs of back-to-back diodes 583, 584 and 585, 586 coupled in parallel across the source-drain circuit of the field effect transistor 574. The cathodes of the diodes 583 and 584 are tied together and returned to ground by a forwardly poled diode 587. Similarly, the anodes of the diodes 585 and 586 are tied together and returned to ground by a reversely poled diode 588. If, however, the output 575 of the decoder tends to overswing, the diode 583 limits any positive overswing and the diode 585 limits any negative overswing at the output and diodes 584 and 586 limit any overswing at the source connection of field affect transistor 574.

The operational amplifier 403 employed in the illustrated embodiment is a composite amplifier combining the relatively high gain bandwidth of a high frequency operational amplifier 601 with the relatively low input offset characteristic of low frequency operational amplifier 602. More particularly, the inverting input of the composite amplifier 403, at the junction of resistors 604 and 562, is coupled by a capacitor 603 to the inverting input of the high frequency amplifier 601 and by a pair of resistors 604 and 605 to the inverting input of the low frequency amplifier 602. Accordingly, it will be understood that the composite amplifier 403 is operated in an inverting mode with respect to ground. Specifically, the low frequency amplifier 602 is operated in an integrating configuration with a capacitor 606 coupled between its output and inverting input terminals. The higher frequency components of the signal are bypassed around the low frequency amplifier 602. These components are applied by the capacitor 603 to the inverting input of the high frequency amplifier 601. The lower frequency components of the input signal are, on the other hand, blocked from the inverting input of the high frequency amplifier 601 by the capacitor 603. Hence, both the high and low frequency components undergo only a single inversion.

The low frequency signal path is through resistors 604 and 605 to the inverting input of operational amplifier 602. A feedback capacitor 606 between the output and inverting input of the amplifier 602 provides a 6 dB per octave gain rolloff, with unity gain at a frequency of about 24kHz. The output of amplifier 602 drives the non-inverting input of high frequency amplifier 601 through resistor 607. This resistor prevents the capacitive reactance between the non-inverting input of the amplifier 601 and circuit common from destabilizing amplifier 602. The composite amplifier 403 has a low frequency gain substantially exceeding the gain of the amplifier 602 by itself. The non-inverting input of the low frequency amplifier 602 is returned to ground by a drift stabilizing resistor 608, which serves as the common return for the composite amplifier 403. The non-inverting input of the high frequency amplifier 601 is, on the other hand, returned to ground through a capacitor 609 so that it has a low impedance termination for higher frequency signal components which may tend to cause the output impedance and gain characteristics of the low frequency amplifier 602 to deteriorate. Furthermore, the non-inverting input of the amplifier 601 is also returned to ground by a pair of parallel, oppositely poled diodes 611 and 612. These diodes limit the voltage swing at the non-inverting input of the operational amplifier and are provided to protect the amplifier in the event of an output overload or some other abnormal condition.

The output of the high frequency amplifier 601, which is the output of the composite amplifier, is coupled by a feedback capacitor 613 to the inverting input of the composite amplifier. Further, a low frequency termination for the inverting input of the high frequency amplifier 601 is provided by returning its inverting input to ground through a resistor 614. The high frequency amplifier 601 is selected to complement the low frequency amplifier 602. To that end, the capacitor 603 is selected so that the high frequency amplifier 601 becomes the dominating amplifier at frequencies just slightly below the unity gain frequency of the low frequency amplifier 602.

The decoder control logic 404 receives the code word to be decoded in parallel form from a bit register (not shown) which has previously received serially the bits of the code word during the 8 clock periods assigned to the code word. The bus 621 coupled to the C inputs of the flip-flop circuits 500, 579, 551-553 and 566 enables the strobing clock to enter the code word bits into the flip-flop circuits. The individual bits of the code word are routed from the external bit register to the D inputs of respective ones of the flip-flop circuits 500, 579, 551–553, 565 and 566. The flip-flop circuits 500, 579, 551–553, 565 and 566 respond to the logic levels of the respective bits applied thereto.

For example, assume that the code word 1011011 is received. Flip-flop circuits 500, 551, 552, 565 and 566 are switched to their set state, while the flip-flop circuits 553 and 579 remain in their reset states. The offset generator 401 provides a decoder reference voltage having a negative polarity, and the attenuator stages 523, 524, 526 and 527 are switched into the attenuator 403. After the operational amplifier 403 has settled, the gain thereof becomes a multiplication factor for the inverted decoder reference voltage, the multiplication factor comprising the multiplicative combination of the attenuation factors assigned to the attenuator stages 523, 524, 526 and 527. The low (0) level bit in the first of the weighted time slots of the code word causes the flip-flop circuit 579 to remain in its reset state. Thus, the output voltage of the operational amplifier is routed to the decoder output terminal 575 via the voltage divider 576, 577 and the source-drain circuit of the field effect transistor 573. This divider removes the most significant bit weight from the output voltage, corresponding to the zero in the most significant bit position.

Recall that the sampled input voltage was encoded by employing successive square roots of the function $$(1+\mu)^{\frac{m+x}{m}}$$

as the attenuation factors, and that the quantized value $v_{1q}$ of the input PAM sample was encoded according to the equation $$v_{1q} = \frac{v_1}{\mu}(1+\mu)^{\frac{n}{m}} - \frac{v_1}{\mu}.$$

The offset voltage generator in the decoder provides a precise reference voltage of magnitude $V_1/\mu$, which is multiplied by the gain of decoder amplifier 403. This gain is established in response to the state of the attenuators in the feedback loop and to the state of the second part 522b of the attenuator stage 522, previously mentioned, which, when inserted, compensates for the factor of 10 minimum gain of amplifier 403 resulting from the fixed attenuation provided by resistors 571 and 572. The gain of amplifier 403, from input to output 575, is $$\begin{aligned} Ay &= (101)^{0}(101)^{16/63}(101)^{8/63}(101)^{0}(101)^{2/63}(101)^{1/63}, \\ &= (101)^{27/63}. \end{aligned}$$

Because the decoder output voltage is referenced to the decoder reference voltage $V_1/\mu$, the decoder output is given by $$\begin{aligned} v_0 &= \frac{V_1}{\mu} A_v - \frac{V_1}{\mu} \\ &= \frac{V_1}{\mu}(101)^{27/63} - \frac{V_1}{\mu}, \end{aligned}$$

which is the quantized voltage corresponding to the 27th quantizing step. The sign of the output voltage is positive as a result of the negative offset voltage and a single inversion through amplifier 403. Thus the quantized value of the original sample is reconstructed at the decoder output 575.

There is some risk that the charging currents drawn by the field effect transistors 541–546, 563 and 564 as they are switched into conduction will tend to overload the input of the operational amplifier 601 and thereby introduce a slowly decaying offset to the output of the operational amplifier 403. To alleviate the problem, there are a pair of transistors 651 and 652, which care connected in an inverted mode with their collectors coupled to the resistor 604, their bases returned to ground, and their emitters coupled via a resistor-capacitor integrator 653, 654 to the non-inverting input of the low frequency operational amplifier 602. Normally, the base-emitter and collector-base voltage drops of the transistors 651 and 652 are very small and both transistors, therefore, generally remain in the non-conductive states. If, however, a substantial switching transient occurs, the collector-base junction of one or the other of the transistors 651 and 652 becomes forwardly biased, thereby causing the transistor to switch into inverted mode conduction. As a result, there is a pulse which is integrated by the resistor 653 and the capacitor 654 to provide an offset voltage for the inverting input of the amplifier 602. At the same time the switching transient delivers an undesired charge to the capacitor 606, thereby tending to offset the output of the operational amplifier 403. Ideally, of course, the values of the resistor 653 and the capacitor 654 are chosen together with the values of the resistor 605 and the capacitor 606 so that the capacitors 606 and 654 charge to the same voltage in response to such a switching transient and have substantially identical decay characteristics. To the extent that the voltages on the capacitors 606 and 654 are identical and decay at the same rate, they effectively cancel each other out due to the common mode rejection provided by the low frequency amplifier 602.

CONCLUSION

It will be understood that we have provided relatively simple methods for complementary encoding and decoding, as well as reliable encoding and decoding apparatus for carrying out such methods. It will be appreciated that we have avoided unnecessary attenuation of the sample in the encoding process. Furthermore, it will be recognized that our encoding process and apparatus and our decoding process and apparatus are applicable to encoding and decoding in accordance with a variety of companding functions, including a non-linear companding function of proven effectivity for maintaining a relatively high signal-to-quantization distortion ratio over a substantial range of signals with only a relatively few time slots alloted to each code word. Finally, it will be understood that the encoder and decoder may be used separately or in combination and may even be exposed to the ordinary temperature swings of an outdoors environment if so desired.

We claim as our invention:

1. An encoder for converting an analog signal sample $v_1$, into a pulse code modulated code word $v_0$, said encoder having a plurality of possible code steps for encoding signal samples of a given polarity and comprising the combination of a. an input means coupled to receive said sample, b. a supply means for providing a reference voltage having a predetermined magnitude of $V_1C_1/\mu$, where $V_1$ is a predetermined overload value of the sample $v_1$, $\mu$ is a predetermined companding constant, and $C_1$ is another predetermined constant;

c. means coupled to said input means and said supply means for summing said sample with said reference voltage to obtain a sum voltage having an unknown magnitude of $(V_1C_1/\mu + v_1)$, said means including attenuator means having an attenuation level incrementally adjustable in accordance with a function $(C_2+\mu)^{-x/m}$, where $C_2$ is a predetermined constant, $\alpha$ is an adjustable variable equal to any one of said code steps, and $m$ is a predetermined code step provided for the overload sample value $V_1$;

d. comparator means coupled to said attenuator means for comparing the sum voltage as attenuated by said atenuator means against a decision point voltage having a predetermined magnitude of $(V_1C_1/\mu - \Delta v)$, where $\Delta v$ is a predetermined offset voltage, to provide an output signal having a polarity dependent on the magnitude of the attenuated sum voltage relative to the magnitude of said decision point voltage;

e. logic means responsive to the polarity of said output signal and coupled to said attenuator means for successively adjusting $\alpha$ to approach $n$ in accordance with the function $$\frac{V_1C_1}{\mu} = (V_1C_1 + v_1)(C_2+\mu)^{\frac{-\alpha}{m}} \qquad \frac{V_1}{\mu} = \frac{(V_1C_1+v_1)(C_2+\mu)^{\frac{-\alpha}{m}}}{\mu}$$

when $\alpha$ equals $n$, where n is the code step corresponding to the sample $v_1$; said logic means including means responding to the polarity of said output signal to produce bits having logic levels digitally indicating, for respective adjustments of $\alpha$, whether the adjusted value of $\alpha$ is greater or lesser than $n$.

2. The encoder of claim 1 wherein said bits comprise the bits for the weighted time slots of the code word $v_0$, whereby said code word provides a digital representation of a divisor $(C_2 + \mu)^{-n/m}$ for dividing the sum voltage $(V_1C_1/\mu + v_1)$ to cause the divided sum voltage to approximate the reference voltage $V_1C_1/\mu$.

3. The encoder of claim 2 where the constant $C_1$ and $C_2$ are selected to have values of unity.

4. The encoder of claim 3 wherein said comparator means comprises an open loop operational amplifier to virtually preclude said output signal from stabilizing at zero.

5. The encoder of claim 4 wherein said attenuator means comprises a plurality of substantially independent attenuation factors logarithmically weighted in accordance with the function $(1 + \mu)^{-\alpha/m}$, where $\alpha$ has successive binary values for the respective attenuation factors, and said logic means include means for switching said factors into and out of said attenuator means to thereby adjust the attenuation level of said attenuator to approach $(1 + \mu)^{-n/m}$.

6. The encoder of claim 5 wherein said attenuator means includes a plurality of substantially independent stages each assigned a respective one of said attenuation factors, and respective switch means coupled to said stages whereby each of said stages may be switched into and out of said attenuator means to multiplicatively contribute and withhold, respectively, the attenuation factor assigned to said stage to and from the attenuation level of said attenuator.

7. The encoder of claim 6 wherein said factors are switched into said attenuator means in declining order of significance at a predetermined digital bit rate, and said logic means further includes means responsive to the polarity of said output signal for selectively switching any but the least significant one of said factors out of said attenuator whenever the attenuation level of said attenuator is increased to a level greater than $(1 + \mu)^{-n/m}$ by switching said one factor into said attenuator.

8. The encoder of claim 1 wherein said offset voltage has a value of zero so that the magnitude of said decision point voltage equals the magnitude of said reference voltage, said comparator means comprises an open loop operational amplifier to thereby virtually preclude said output signal from stabilizing at zero, said attenuator means includes a plurality of substantially independent attenuation factors logarithmically weighted to correspond to the function $(C_2 + \mu)^{-\alpha/m}$ for respective ones of successive values of $\alpha$, and said logic means includes means for switching said factors into and out of said attenuation means to thereby adjust the attenuation level thereof to approach $(C_2 + \mu)^{-n/m}$.

9. The encoder of claim 8 wherein said attenuator means includes a plurality of substantially independent stages each assigned a respective one of said factors, and respective switch means coupled to said stages whereby each of said stages may be switched into and out of said attenuator means to multiplicatively contribute or withhold, respectively, the factor assigned thereto to and from the overall attenuation level of said attenuator; and said logic means includes a register for supplying control signals for said switch means to switch said stages into said attenuator means in a predetermined order, and means coupled between said comparator means and said register for selectively signaling said register whenever the attenuation level of said attenuator means exceeds $(C_2 + \mu)^{-n/m}$ so that said register then supplies a further control signal for said switch means to selectively switch out of said attenuation means the stage most recently switched into said attenuator means.

10. The encoder of claim 9 wherein said order is selected so that said attenuation factors are multiplicatively contributed to the attenuation level of said attenuator in declining order of significance.

11. The encoder of claim 1 wherein said attenuator means includes a plurality of substantially independent attenuation factors logarithmically weighted to correspond to the function $(C_2+\mu)^{-\alpha/m}$ for respective values of $\alpha$, said offset voltage has a value substantially equal to one-half the voltage value of that portion of the input sample corresponding to the least significant of said attenuation factors so that the magnitude of said decision point voltage is offset from the magnitude of said reference voltage, said comparator means includes an open loop operational amplifier to thereby virtually preclude said output signal from stabilizing at zero, and said logic means includes means for switching said factors into and out of said attenuator means to thereby adjust the attenuation level of said attenuator means to approach $(C_2+\mu)^{-n/m}$.

12. The encoder of claim 11 wherein said attenuator means includes a plurality of substantially independent stages each assigned a respective one of said factors, and respective switch means coupled to said stages whereby each of said stages may be switched into and out of said attenuator means to multiplicatively contribute or withhold, respectively, the factor assigned thereto to and from the overall attenuation level of said attenuator; and said logic means includes a register for supplying control signals for said switch means to switch said stages into said attenuator means in a predetermined order, and means coupled between said comparator means and said register for selectively signaling said register whenever the attenuation level of said attenuator means exceeds $(C_2 + \mu)^{-n/m}$ so that said register then supplies a further control signal for said switch means to selectively switch out of said attenuation means the stage most recently switched into said attenuator means.

13. The encoder of claim 12 wherein said order is selected so that said attenuation factors are multiplicatively contributed to the attenuation level of said attenuator in declining order of significance.

14. An encoder for generating a train of pulse code modulated code words in response to a series of bipolar analog signal samples having a predetermined repetition rate, said encoder comprising the combination of a. input means coupled to serially receive said samples;

b. a reversible polarity supply means for providing a reference voltage having a predetermined magnitude;

c. means coupled to said input means and said supply means for summing each of said samples with said reference voltage to thereby obtain for each sample a sum voltage having an unknown magnitude, said means including 1. an attenuator means having a plurality of substantially independent stages associated with respective attenuator factors, and
2. switch means coupled to said stages for switching said stages into and out of said attenuator means, whereby said attenuator means has an attenuation level incrementally adjustable from substantially zero to a higher predetermined limit;

d. comparator means coupled to said attenuator means for comparing the magnitude of said sum voltage against the magnitude of a predetermined decision point voltage to provide an output signal having a polarity dependent on the magnitude of the attenuated sum voltage relative to the magnitude of said decision point voltage;

e. logic means for cycling said encoder at said repetition rate including 1. first bistable means coupled to said supply means,
2. second bistable means coupled to said switch means,
3. means coupled to said first and second bistable means for switching said bistable means to a first state in preparation for each encoding cycle, whereby said stages are then all removed from said attenuator means to reduce the attenuation level thereof to substantially zero and said reference voltage then has a predetermined polarity,
4. clock means for advancing said encoder at a predetermined digital bit rate to thereby divide such encoding cycle into a plurality of equal length time slots,
5. means coupled to said comparator means and controlled by said clock means for outputting respective bits into said time slots, with said bits having logic levels dependent on the polarity of said output signal on a time slot-by-slot basis,
6. means coupled between said comparator means and said first bistable means to switch said bistable means to a second state to thereby reverse the polarity of said reference voltage only if the polarity of said output signal during the first time slot of an encoding cycle is consistent with said decision point voltage having a greater magnitude at that time than said sum voltage;
7. means coupled between said clock means and said second bistable means for sequentially switching said stages into said attenuator means at said digital bit rate and beginning as the encoder advances to the second time slot of each encoding cycle, and
8. means coupled between said comparator means and said bistable means enabled at any time, other than after the encoder has advanced to the final time slot of a cycle, the magnitude of said sum voltage drops below the magnitude of said decision point voltage to selectively switch the most recently inserted of said stages out of said attenuator means.

15. The encoder of claim 14 wherein said reference voltage is selected to equal $V_1C_1/\mu$, where $V_1$ is a predetermined overload input signal which follows the polarities of the samples $v_1$, $\mu$ is a predetermined companding constant, and $C_1$ is another predetermined constant, whereby the sum voltage for each sample has a magnitude of $(V_1C_1/\mu + v_1)$ at least as the encoding cycle advances to the second of said time slots; the factors assigned to said attenuator stages are logarithmically weighted to correspond to the function $(C_2 + \mu)^{-\alpha/m}$ for respective values of $\alpha$, where $C_2$ is another predetermined constant, $\alpha$ is an adjustable variable defining any one of the code steps available for encoding samples of a given polarity, and m is the code step corresponding to the input overload signal $V_1$; and the magnitude of said decision point voltage is selected to substantially equal $(V_1C_1/\mu - \Delta v)$, where $\Delta v$ represents any offset between the magnitude of said reference voltage and the magnitude of the decision point voltage; whereby each code word includes a bit having a logic level digitally representing the polarity of the applied sample $v_1$, followed by a plurality of bits having logic levels digitally representing, in factored form, a divisor approaching $(C_2 + \mu)^{-n/m}$ where n is the code step corresponding to the applied sample $v_1$.

16. The encoder of claim 15 where $C_1$ and $C_2$ are both selected to equal unity.

17. The encoder of claim 16 wherein $\Delta v$ is selected to equal zero, said comparator means includes an open loop operational amplifier to virtually preclude said output signal from stabilizing at zero, and said attenuator stages are switched into said attenuator means in a predetermined order starting with the stages assigned the most significant of said factors and proceeding in order to the stage assigned the least significant of said factors.

18. The encoder of claim 16 wherein $\Delta v$ is selected to equal one-half the voltage value of that portion of the input sample corresponding to the least significant of said factors, said comparator means includes an open loop operational amplifier to virtually preclude said output signal from stabilizing at zero, and said attenuator stages are switched into said attenuator means in a predetermined order starting with the stages assigned the most significant of said factors and preceeding in order to the stage assigned the least significant of said factors.

* * * * *

UNITED STATES PATENT AND TRADEMARK OFFICE

CERTIFICATE OF CORRECTION

PATENT NO. : 3,882,484

DATED : May 6, 1975

INVENTOR(S) : Adrian Paul Brokaw and Daniel Y.S. Chin

It is certified that error appears in the above-identified patent and that said Letters Patent are hereby corrected as shown below:

Column 6, line 38, delete equation (1) and substitute the following:

$$\frac{v_0}{V_0} = \frac{\log_a\left(C_1 + \mu \frac{v_1}{V_1}\right)}{\log_a (C_2 + \mu)} \qquad (1)$$

Column 6, line 65, delete equation (2) and substitute the following:

$$\frac{v_0}{V_0} = \frac{\ln\left(1 + \mu \frac{v_1}{V_1}\right)}{\ln (1 + \mu)} \qquad (2)$$

Column 7, line 1, delete equation (3) and substitute the following:

$$v_0 = V_0 \frac{\ln\left(1 + \mu \frac{v_1}{V_1}\right)}{\ln (1 + \mu)} \qquad (3)$$

Column 8, line 25, delete equation (4) and substitute the following:

$$\frac{v_0}{V_0} \log_a (C_2 + \mu) = \log_a \left(C_1 + \mu \frac{v_1}{V_1}\right) \qquad (4)$$

UNITED STATES PATENT AND TRADEMARK OFFICE

CERTIFICATE OF CORRECTION

PATENT NO. : 3,882,484

DATED : May 6, 1975

INVENTOR(S) : Adrian Paul Brokaw and Daniel Y.S. Chin

It is certified that error appears in the above-identified patent and that said Letters Patent are hereby corrected as shown below:

Column 8, line 64, delete equation (8) and substitute the following:

$$\frac{V_1}{\mu} = \left(\frac{V_1 C_1}{\mu} + v_1\right)(C_2+\mu)^{-\frac{n}{m}} \qquad (8)$$

Column 9, line 35, delete equation (9) and substitute the following:

$$\frac{V_1}{\mu} = \left(\frac{V_1 C_1}{\mu} + v_1\right)(C_2+\mu)^{-\frac{\alpha}{m}}, \text{ if } \alpha = n \qquad (9)$$

Column 9, line 40, delete equation (10) and substitute the following:

$$\frac{V_1}{\mu} > \left(\frac{V_1 C_1}{\mu} + v_1\right)(C_2+\mu)^{-\frac{\alpha}{m}}, \text{ if } \begin{matrix}[v_1 > 0 \text{ and } \alpha > n] \\ \text{or} \\ [v_1 < 0 \text{ and } \alpha < n]\end{matrix} \qquad (10)$$

Column 9, line 45, delete equation (11) and substitute the following:

$$\frac{V_1}{\mu} < \left(\frac{V_1 C_1}{\mu} + v_1\right)(C_2+\mu)^{-\frac{\alpha}{m}}, \text{ if } \begin{matrix}[v_1 > 0 \text{ and } \alpha < n] \\ \text{or} \\ [v_1 < 0 \text{ and } \alpha > n]\end{matrix} \qquad (11)$$

UNITED STATES PATENT AND TRADEMARK OFFICE

CERTIFICATE OF CORRECTION

PATENT NO. : 3,882,484

DATED : May 6, 1975

INVENTOR(S) : Adrian Paul Brokaw and Daniel Y.S. Chin

It is certified that error appears in the above-identified patent and that said Letters Patent are hereby corrected as shown below:

Column 10, line 1, delete equation (12) and substitute the following:

$$\frac{V_1}{\mu} = \left(\frac{V_1}{\mu} + v_1\right)(1+\mu)^{-\frac{\alpha}{m}}, \text{ if } \alpha = n \qquad (12)$$

Column 10, line 5, delete equation (13) and substitute the following:

$$\frac{V_1}{\mu} > \left(\frac{V_1}{\mu} + v_1\right)(1+\mu)^{-\frac{\alpha}{m}}, \text{ if } [v_1 > 0 \text{ and } \alpha > n] \text{ or } [v_1 < 0 \text{ and } \alpha < n] \qquad (13)$$

Column 10, line 10, delete equation (14) and substitute the following:

$$\frac{V_1}{\mu} < \left(\frac{V_1}{\mu} + v_1\right)(1+\mu)^{-\frac{\alpha}{m}}, \text{ if } [v_1 > 0 \text{ and } \alpha < n] \text{ or } [v_1 < 0 \text{ and } \alpha > n] \qquad (14)$$

(Claim 1)

Column 51, line 6, "atenuator" should be changed to --attenuator--.

UNITED STATES PATENT AND TRADEMARK OFFICE

CERTIFICATE OF CORRECTION

PATENT NO. : 3,882,484

DATED : May 6, 1975

INVENTOR(S) : Adrian Paul Brokaw and Daniel Y.S. Chin

It is certified that error appears in the above-identified patent and that said Letters Patent are hereby corrected as shown below:

(Claim 1)

Column 51, line 20, delete the equations shown therein and substitute the following:

$$\frac{V_1}{\mu} = \frac{(V_1 C_1 + v_1)}{\mu}(C_2 + \mu)^{-\frac{\alpha}{m}}$$

Signed and Sealed this

*twenty-ninth* Day of *June 1976*

[SEAL]

*Attest:*

RUTH C. MASON
*Attesting Officer*

C. MARSHALL DANN
*Commissioner of Patents and Trademarks*